(12) United States Patent
Daoura et al.

(10) Patent No.: US 10,074,049 B2
(45) Date of Patent: Sep. 11, 2018

(54) REDUCED THICKNESS TRACKING DEVICE

(71) Applicant: PB Inc., Renton, WA (US)

(72) Inventors: Daniel Daoura, Renton, WA (US); Nicholas Pearson-Franks, Sammamish, WA (US)

(73) Assignee: PB Inc., Renton, WA (US)

( * ) Notice: Subject to any disclaimer, the term of this patent is extended or adjusted under 35 U.S.C. 154(b) by 0 days.

(21) Appl. No.: 15/382,245

(22) Filed: Dec. 16, 2016

(65) Prior Publication Data

US 2017/0103297 A1 Apr. 13, 2017

Related U.S. Application Data

(63) Continuation of application No. 14/301,213, filed on Jun. 10, 2014, now Pat. No. 9,564,774.

(51) Int. Cl.
*G06K 19/077* (2006.01)
*H02J 7/02* (2016.01)
(Continued)

(52) U.S. Cl.
CPC ........ *G06K 19/07758* (2013.01); *A44B 15/00* (2013.01); *G06K 19/077* (2013.01); *G06Q 10/00* (2013.01); *G06Q 10/0833* (2013.01); *G06Q 10/10* (2013.01); *G08B 13/2417* (2013.01); *G08B 21/24* (2013.01); *H02J 7/025* (2013.01); *H02J 7/35* (2013.01); *H02J 50/10* (2016.02); *H04L 67/10* (2013.01); *H04W 4/02* (2013.01); *H04W 4/38* (2018.02); *H04W 4/60* (2018.02);
(Continued)

(58) Field of Classification Search
CPC ... G06K 19/07758; G06K 19/077; H02J 7/35; H02J 7/025; H02J 50/10; H05K 5/0086; H05K 7/1427; H05K 5/0217
USPC ........................................................ 320/101
See application file for complete search history.

(56) References Cited

U.S. PATENT DOCUMENTS

| 4,500,051 | A | | 2/1985 | Cottle, Jr. et al. |
| 5,014,040 | A | * | 5/1991 | Weaver et al. .......... A44C 5/14 340/539.1 |

(Continued)

FOREIGN PATENT DOCUMENTS

| WO | 2011/057287 A1 | 5/2011 |
| WO | 2013/188374 A2 | 12/2013 |

OTHER PUBLICATIONS

Final Office Action dated Jun. 3, 2016, issued in U.S. Appl. No. 14/820,393, filed Aug. 6, 2015, 26 pages.
(Continued)

*Primary Examiner* — Sun Lin
(74) *Attorney, Agent, or Firm* — Christensen O'Connor Johnson Kindness PLLC

(57) ABSTRACT

In a tracking device, a crescent-shaped printed circuit board (PCB) partially encircles a battery to minimize thickness of the tracking device. A speaker and a light emitting diode (LED) emit alerts upon command of a control apparatus or in response to a motion or a temperature sensed by a sensor. A local network has one hub for tracking a plurality of tracking devices and a wider area network has multiple hubs for more detailed tracking of the plurality of tracking devices. The wide area network tracks the plurality of tracking devices anywhere and stores data of each tracking device including its last known position and its sensor data.

20 Claims, 18 Drawing Sheets

(51) Int. Cl.

| | | |
|---|---|---|
| *H05K 5/02* | (2006.01) | |
| *H05K 5/00* | (2006.01) | |
| *H05K 7/14* | (2006.01) | |
| *H02J 7/35* | (2006.01) | |
| *H02J 50/10* | (2016.01) | |
| *G08B 21/24* | (2006.01) | |
| *H04W 4/02* | (2018.01) | |
| *G06Q 10/00* | (2012.01) | |
| *H04L 29/08* | (2006.01) | |
| *G06Q 10/10* | (2012.01) | |
| *A44B 15/00* | (2006.01) | |
| *G06Q 10/08* | (2012.01) | |
| *G08B 13/24* | (2006.01) | |
| *H04W 4/38* | (2018.01) | |
| *H04W 4/60* | (2018.01) | |

(52) U.S. Cl.
 CPC ......... *H05K 5/0086* (2013.01); *H05K 5/0217* (2013.01); *H05K 7/1427* (2013.01); *A44B 15/005* (2013.01)

(56) References Cited

U.S. PATENT DOCUMENTS

| | | |
|---|---|---|
| 5,528,460 A | 6/1996 | Byrd |
| 5,587,955 A | 12/1996 | Lee et al. |
| 5,610,596 A | 3/1997 | Petitclerc |
| 5,963,130 A | 10/1999 | Schlager et al. |
| 6,847,892 B2 | 6/2005 | Zhou et al. |
| 7,142,982 B2 | 11/2006 | Hickenlooper et al. |
| 7,274,295 B2 | 9/2007 | Koch et al. |
| 7,321,774 B1 | 1/2008 | Lau et al. |
| 8,299,920 B2 | 10/2012 | Hamm et al. |
| 8,328,092 B1 | 12/2012 | Robinson et al. |
| 8,395,968 B2 | 3/2013 | Vartanian et al. |
| 8,421,619 B2 | 4/2013 | Scalisi et al. |
| 8,427,969 B1 | 4/2013 | Juillard |
| 8,456,329 B1 | 6/2013 | Tran et al. |
| 8,502,900 B2 | 8/2013 | Fujino et al. |
| 8,577,392 B1 | 11/2013 | Pai et al. |
| 8,604,925 B2 | 12/2013 | Monte et al. |
| 8,620,343 B1 | 12/2013 | Lau et al. |
| 8,620,841 B1 | 12/2013 | Filson et al. |
| 8,630,699 B2 | 1/2014 | Baker et al. |
| 8,633,817 B2 | 1/2014 | Khorashadi et al. |
| 8,665,784 B2 | 3/2014 | Kang et al. |
| 9,392,404 B2 * | 7/2016 | Daoura et al. .......... H04W 4/02 |
| 9,564,774 B2 * | 2/2017 | Daoura et al. .......... G06Q 10/00 |
| 2002/0070861 A1 | 6/2002 | Teller |
| 2003/0047530 A1 | 3/2003 | Durbin |
| 2004/0198389 A1 | 10/2004 | Alcock et al. |
| 2005/0139686 A1 | 6/2005 | Helmer et al. |
| 2007/0070818 A1 | 3/2007 | Inomata et al. |
| 2007/0194913 A1 | 8/2007 | Yokoshima et al. |
| 2009/0058663 A1 | 3/2009 | Joshi et al. |
| 2010/0080175 A1 | 4/2010 | Kang et al. |
| 2010/0178913 A1 | 7/2010 | Herbert et al. |
| 2010/0283600 A1 | 11/2010 | Herbert et al. |
| 2011/0074587 A1 | 3/2011 | Hamm et al. |
| 2011/0140884 A1 | 6/2011 | Santiago et al. |
| 2011/0254760 A1 | 10/2011 | Lloyd et al. |
| 2012/0007713 A1 | 1/2012 | Nasiri et al. |
| 2012/0052870 A1 | 3/2012 | Habicher |
| 2012/0122480 A1 | 5/2012 | Scalisi et al. |
| 2012/0186312 A1 | 7/2012 | Lowder et al. |
| 2012/0309408 A1 | 12/2012 | Marti et al. |
| 2013/0002481 A1 | 1/2013 | Solomon |
| 2013/0159350 A1 | 6/2013 | Sankar et al. |
| 2013/0166198 A1 | 6/2013 | Funk et al. |
| 2013/0179110 A1 | 7/2013 | Lee |
| 2013/0274587 A1 | 10/2013 | Coza et al. |
| 2013/0274954 A1 | 10/2013 | Jordan, Jr. et al. |
| 2014/0049376 A1 | 2/2014 | Ng |
| 2014/0213301 A1 | 7/2014 | Evans et al. |
| 2014/0228783 A1 | 8/2014 | Kraft |
| 2014/0279435 A1 | 9/2014 | Holman et al. |
| 2014/0297900 A1 | 10/2014 | Herbert et al. |
| 2014/0324585 A1 | 10/2014 | Mederos |
| 2015/0235120 A1 | 8/2015 | Warren |
| 2015/0356393 A1 * | 12/2015 | Daoura et al. .......... G06Q 10/00 340/8.1 |
| 2015/0356858 A1 * | 12/2015 | Daoura et al. .......... G06Q 10/00 340/539.32 |
| 2015/0356861 A1 * | 12/2015 | Daoura et al. ..... G08B 21/0269 340/539.13 |
| 2015/0356862 A1 * | 12/2015 | Daoura et al. .......... G08B 25/10 340/686.6 |

OTHER PUBLICATIONS

Non-Final Office Action dated Nov. 6, 2015, issued in U.S. Appl. No. 14/820,393, filed Aug. 6, 2015, 30 pages.
The Tile App—Item Finder for Anything, Photo, Facebook, Aug. 8, 2013.

* cited by examiner

REDUCED THICKNESS TRACKING DEVICE

CROSS-REFERENCES TO RELATED APPLICATIONS

This application is a continuation of U.S. application Ser. No. 14/301,213, filed Jun. 10, 2014, the disclosure of which is hereby expressly incorporated by reference herein in its entirety.

This application is related to U.S. patent application Ser. No. 14/301,236, filed Jun. 10, 2014; and U.S. patent application Ser. No. 14/301,250, filed Jun. 10, 2014.

BACKGROUND

This invention is in the field of wireless electronic tracking devices and networks.

There are numerous devices and systems for tracking objects, pets and individuals. For example, radio frequency identification (RFID) tags have long been used to track objects, pets, cattle, and hospital patients. A reader generates an electromagnetic field in the tag and that field powers a small transmitter in the tag that emits a signal with the identity of the tag. The reader picks up the tag's radio waves and interprets the frequencies as meaningful data. RFID tags require close proximity between the reader and the tag and such systems are often limited to generating only identity information and do not provide information about the motion, heading, time, temperature or other environmental characteristics in the vicinity of the tag.

There are systems with sensors attached to clothing or objects for monitoring the physical activity of those wearing the clothing of the motion of the object. See, for example, Pub. No. US 2013/0274587. It has sensor and transmitter to send information about the motion of the object and the temperature sensed by the object. A base station uses GPS or triangulation to identify the location of the object. Although the monitoring system may have one or more alerts, no alerts are provided on the sensors on the clothing of the users.

Other tracking systems use tracking sensors with built-in GPS systems and transceivers for establishing wireless communication with a network. One such system is found in U.S. Pat. No. 8,665,784. However, the power required to operate a GPS system often rapidly drains the battery of such tracking sensors or requires the sensors to have a relatively large package, which is not readily attached to small objects, pets or people.

The prior art solutions do not address the problem of finding small, lost objects in within a room or house as well as at a distance. Known solutions are not compatible or cost effective for individuals. Large sensors that require recharging many batteries impose too high a level of maintenance on an individual. None of the above solutions will find a small sensor that may be hidden in drawer or under a pillow. They do not provide control apparatus for commanding the sensor to emit an audible or visual alert. The prior art shown above is silent regarding the problems of pairing sensors with location, remote controlling a sensor, and using a sensor to remote control a sensor control device.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

Embodiments of the tracking device of the invention are configurable by an individual user to help find lost objects and monitor pets and the activities of small children or hospital patients. The tracking device is a comprehensive solution to locate, monitor and track missing pets, people, luggage, inventory, tools and items of interest. In some embodiments the tracking device incorporates various sensors and control mechanisms that make the tracking device a versatile multi-function device which can remotely control other devices such as smartphones, tablets, or computers. The device is instrumental in shaping and creating a market for the "internet of things" by allowing a user or network of users to seamlessly share sensor data while providing a regional or global picture of environmental conditions such as temperature, movement, trends in a particular area or simply a collaborative picture of all dogs active in a particular city at a specific time. The tracking device has a speaker and a light emitting diode. A control apparatus is associated with the tracking device. The control apparatus may command the tracking device to emit an alert, including a buzz or flashing light. If a tracked object is inside a drawer or under a pillow, the person searching for the object will hear the buzz or see the flashing light. The control apparatus may also set its own alerts to trigger based upon the distance between the tracking device and the control apparatus. Alerts can be based upon pairing the location of the tracking device to the alert so that alerts are only provided at predetermined locales and/or predetermined times.

Embodiments of the tracking device conserve power and space. The electronics of the tracking device are carried on a crescent-shaped printed circuit board that partially encircles a battery. Encircling the battery with the printed circuit board reduces the thickness of the tracking device. Top and bottom covers enclose the printed circuit board and the battery. One cover has an opening to access the battery. In some embodiments the battery may be wirelessly recharged with inductive or solar powered chargers.

The electronics include a Bluetooth low energy transmitter that has enough computing power to control sensors and the tracking device. A ceramic antenna further conserves space. In some embodiments the sensors include a multi-axis sensor such as a nine-axis motion sensor, and a temperature sensor. Embodiments may omit GPS sensing circuitry and rely on the GPS circuitry in control devices. Other embodiments include GPS circuitry. Using one or more programs in a control apparatus, a tracking device can be set to trigger one or more alerts depending upon the distance between the tracking device and the control apparatus.

There are multiple network embodiments for the tracking devices. In a local network a hub communicates with local tracking devices and relays their sensor outputs to a cloud/internet site. Multiple hubs can form a wider area network that allows the hubs to communicate with each other and triangulate the approximate position of each tracking device. In a still wider area network, tracking devices anywhere in the world can be monitored by position, time of day, motion and any other characteristic or parameter sensed by the a tracking device.

The tracking devices are assigned to an owner-user who may grant privileges to others for using the devices of the owner. The owner-user may also have shared privileges with tracking devices of other users. Objects lost anywhere in the world may be located by using position data provided by other control devices that carry the control program and are registered to the cloud/internet site.

The embodiments described herein provide a computer program that is installed on a control apparatus. The computer program enables the control apparatus to detect tracking devices within range of the control apparatus and acquire control of the tracking device unless another control apparatus already controls the device. The control apparatus may also release from its control one or more selected tracking devices. The control program also allows the user to keep private the information of the tracking device. Once set to private, only the control apparatus or other designated apparatuses or individuals will have access to data from the tracking device.

The control program allows the user of the user to select at least one alert. The control device or the tracking device or both may generate the alerts. In order to trigger the alert, the tracking device broadcasts a beacon signal via a Bluetooth transceiver. The signal strength of the beacon signal received by the control apparatus is representative of the distance or range between the control apparatus and the tacking apparatus. The signal strength is considered a condition for a distance alert. If a control apparatus suddenly receives a beacon signal of a controlled tracking device, the control apparatus may indicate the device has returned to a location proximate the control apparatus. Likewise, failure to detect a beacon signal of a controlled tracking device indicates the device is outside the range of the control apparatus. The relative strength of the beacon signal is proportional to the proximity between the control apparatus and the controlled tracking device.

The control apparatus or the tracking device or both may monitor other conditions. Each other condition and combinations of two or more conditions may be paired or otherwise associated with each other to provide multiple conditions for triggering an alert. In addition to the range signal beacon, the tracking device may carry one or more sensors and each sensor may output one or more signals representative of other conditions monitored by the sensors. Other conditions include and are not limited to motion of the sensor in any direction or in a particular direction; temperature and other signals representative of time, the geographic location of the tracking device or both, motion and other physical, biological or chemical conditions being monitored by sensors. As such, each condition monitored may be associated or paired with any other one or more conditions to provide multiple conditions that must be met to trigger an alert.

The beacon signal includes the identification information for the tracking device and a signal representative of the status of the charge of the battery. The program displays both the range and battery status information. As explained above, the location of the tracking device may be detected by other control devices, which may assist the owner in locating a lost tracking device. Accordingly, the control apparatus, if associated with network of other control apparatuses, may acquire information about the location of a tracking device remote from the other networked control apparatus. The control program provides a feature for selecting a map displaying the remote location of each tracking device controlled by the control apparatus.

In other embodiments the control program allows the control system to remotely control operation of the tracking device or allow the tracking device to remotely control the control apparatus or both. The control program enables the control apparatus to activate an audible or visual alarm or both by selecting a corresponding alarm button shown on a display of the control program. The control program allows the control apparatus to allow one of more of its operations to be controlled by the tracking device. The control program permits the user to set the multi-function button on the tracking device to operate a camera, an email or a text messaging system of the control apparatus. In addition, the multi-function button may be programmed with the control program to activate an audible alarm on the control apparatus. For example, pressing the multi-function button may cause a smartphone control apparatus to emit a distinctive sound.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

While exemplary embodiments have been illustrated and described, it will be appreciated that various changes can be made therein without departing from the spirit and scope of the invention.

Figure 1A:
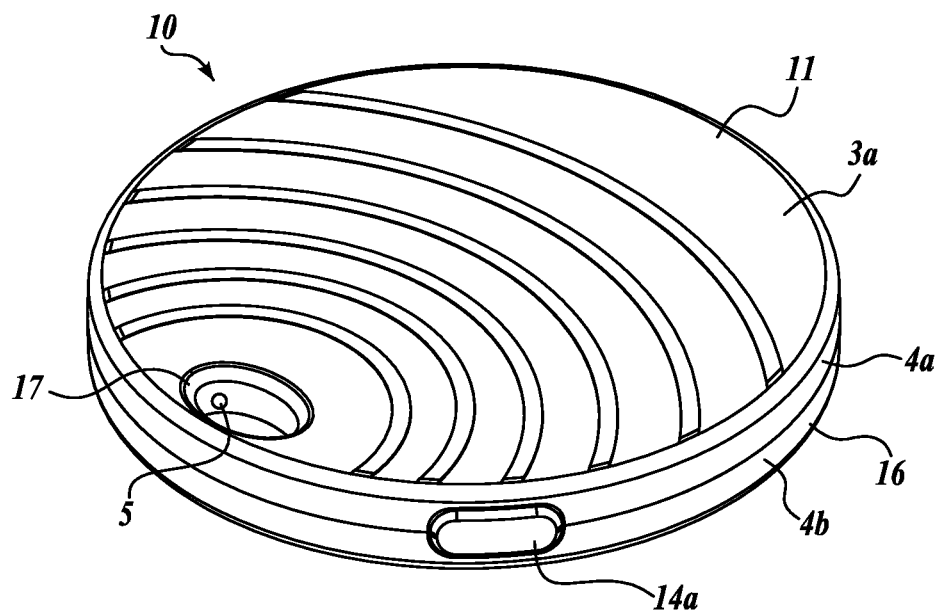
FIG. 1A is a perspective view of the top of a tracking device.
Figure 1B:
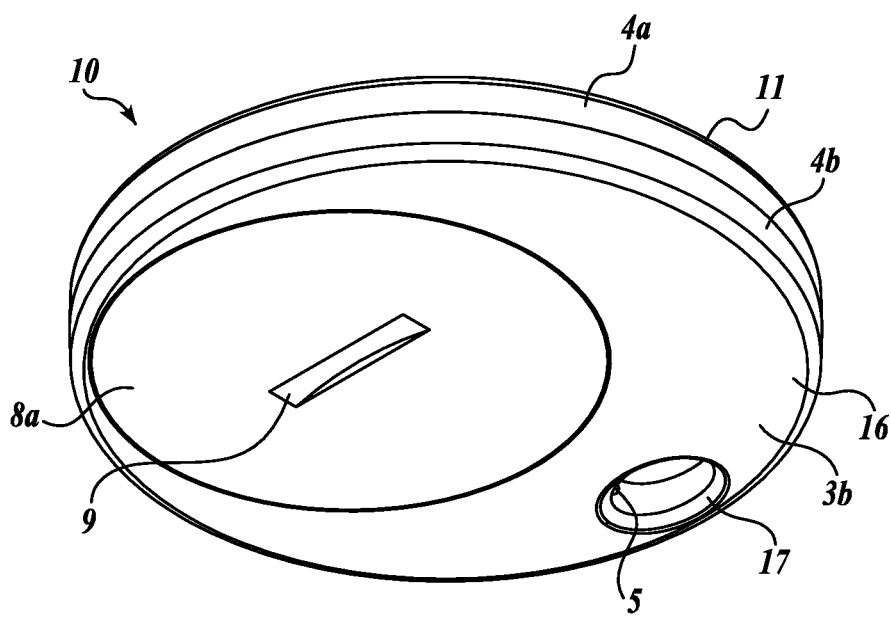
FIG. 1B is a reverse perspective view of the tracking device shown in FIG. 1A.

One embodiment of a tracking device 10 is shown in FIGS. 1A, 1B. The tracking device 10 is an assembly having outside covers 11, 16. The covers are made of glass filled acrylonitrile butadiene styrene (ABS) thermoplastic which is light in weight, can be injection molded and is resistant to impact, heat, water, acids, alkalis, alcohols and oils. The covers 11, 16 have circular-shaped bodies 3*a*, 3*b*, each with an annular wall 4*a*, 4*b*. The covers also form a through-hole 17 for receiving a cord or chain to attach the tracking device to an object, a pet or the clothing of a person.

Figure 1C:
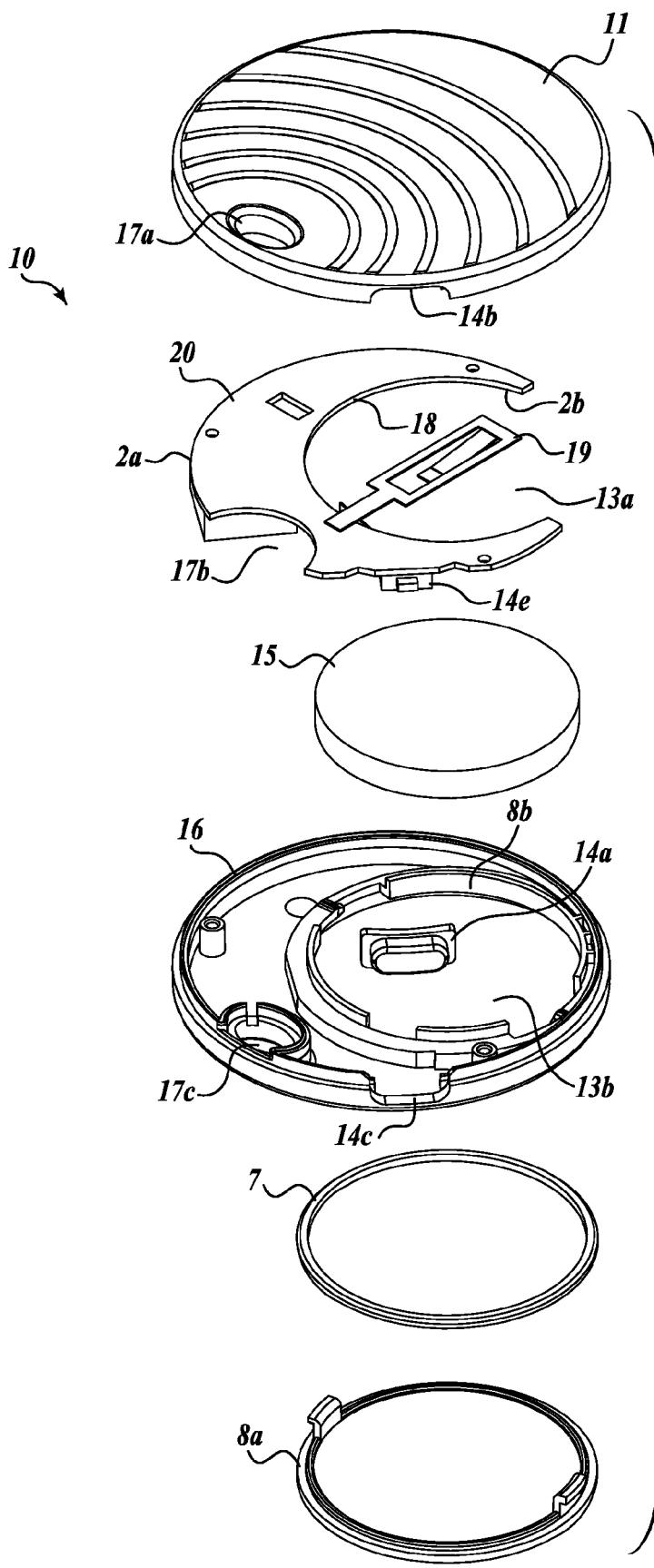
FIG. 1C is an exploded top-to-bottom perspective view of an assembly for a tracking device showing a covers on opposite sides of a printed circuit board (PCB), battery next to an opening in the a PCB and a battery connector on one of the covers.
Figure 1D:
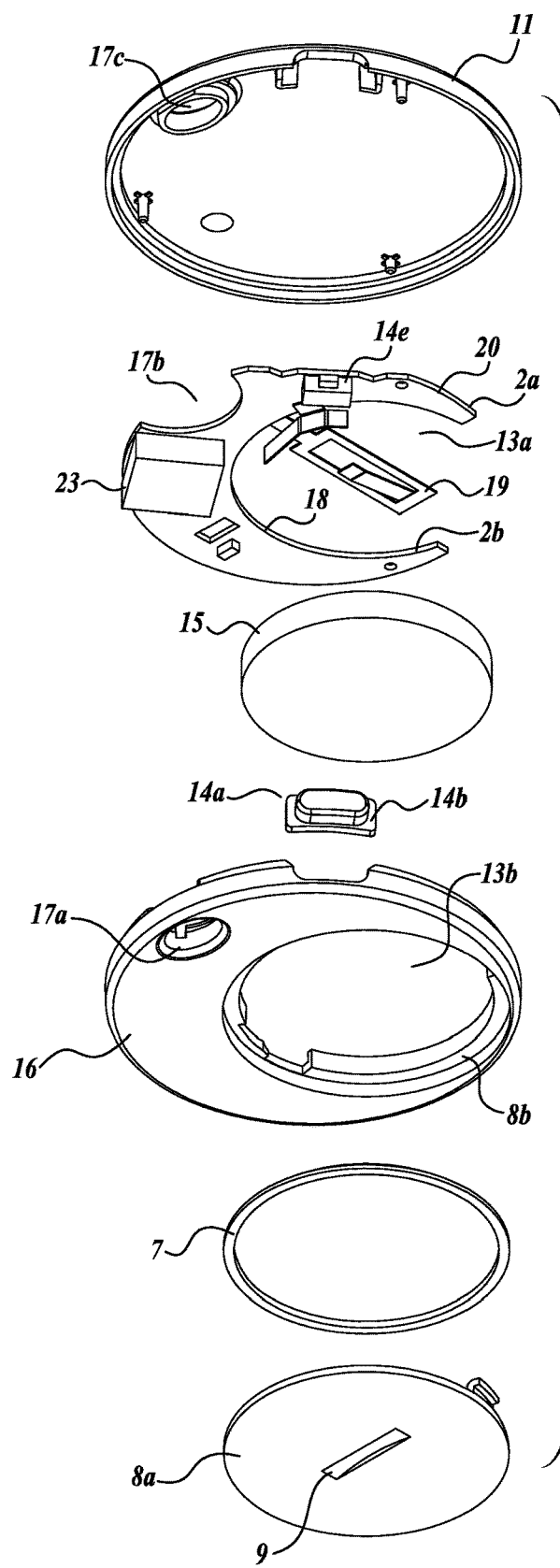
FIG. 1D is a reverse exploded perspective view of the tracking device shown in FIG. 1C.

Turning to FIGS. 1C, 1D, the covers 11, 16 enclose a printed circuit board (PCB) 12 and a battery 15. The PCB 12 has a crescent-shaped body with an outer edge 2*a* having a radius of curvature slightly smaller than the radius of curvature of the covers 11, 16 and an inner edge 2*b* with a smaller radius of curvature. Two circular arcs of different diameters thus define the crescent shape of the PCB 12. The PCB 12 has an opening 13*a* for receiving a circular battery 15.

Figure 1E:
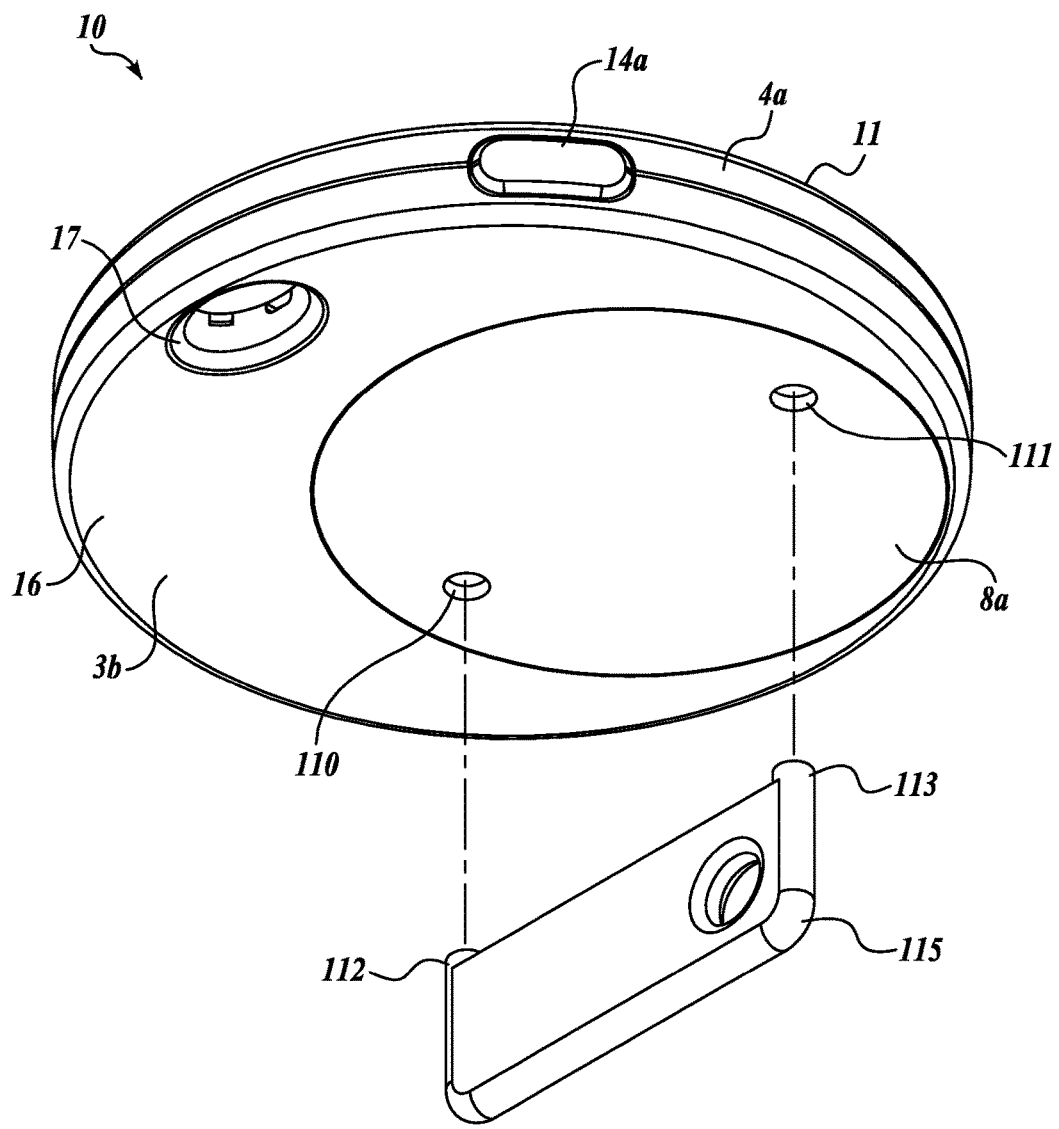
FIG. 1E is a view of an alternate battery cover.

The diameter of the battery 15 is smaller than the diameter of opening 13 in the PCB 12. The battery 15 has one terminal on its surface and another terminal on its edge. The edge of the battery engages a conductive edge connector 18 on the inner edge 2*b* of the PCB 12. Another conductor has a spring-biased body 19 that extends from the PCB 12 toward the middle of a surface of the battery 15. The battery 15 is held in the opening 13 between the two covers 11, 16 and against the conductive edge connector 18 on the inner edge 2*b* of the PCB 12. Cover 11 has a ripple wave design on its surface. Cover 16 has an opening 13*b* sufficient to receive the battery 15. A threaded battery cover 8*a*, a matching threaded annular wall 8*b* and an O-ring 7 secures battery 15 in the openings 13*a*, 13*b*. A detent 9 in the surface of the battery cover 8 receives an opening tool, such a screwdriver or the edge of a coin (not shown). Inserting the tool in the detent and rotating the cover 8*a* open the cover to access the battery. In an alternate embodiment as shown in FIG. 1E, the slot 9 is replaced by two spaced-apart holes 110, 111. A key 115 has two prongs 112, 113 that fit into the spaced-apart holes and allow a user to apply torque to the cover 8*a* to open it and remove the battery 15.

The tracking device is assembled by inserting a PCB 12 with component circuitry on the inside surface of cover 16. The other cover 11 is placed on top of cover 16 to define a cavity that holds the battery 15 and the PCB 12. The two covers are ultrasonically sealed to resist water or other materials from entering the device 10. A battery is inserted through opening 13*b* in cover 16 and the batter cover 8*a* engages the O-ring 7 and the threaded wall 8*b*. Cover 8*a* rotates in opposite directions to close or open. By encircling the battery with the PCB 12, the PCB does not increase the thickness of the assembly that is determined only by the covers 11, 16 and the thickness of the battery 16. Some embodiments are 5 mm thin and 40 mm in diameter. Unlike other devices that use batteries, the PCB does not contribute to the thickness of the device 10 because the battery 15 does not rest on the PCB 12 but is partially encircled by the opening 13*c* in the PCB 12.

A multi-function button 14*a* extends from an opening defined by half-oval walls 14*b*, 14*c* in the sidewall of the junction of the annular walls 4*a*, and 4*b*. In one embodiment there is a single multi-function rubber button 14*a* that extends from the edge of the device. Button 14*a* is held in place by wall edges 14*b*, 14*c* that overlap surface 14*d* to hold the rubber button 14*a* inside the covers 11,16. The rubber button is aligned with a mechanical button 14*e* that is attached to the PCB 12 and coupled to core device 21.

The covers 11, 16 and the PCB 12 have aligned openings 17*a*, 17*b*, 17*c* that create an external key ring hole 17 for holding a key ring, a carrying chain or cord. As will be explained below, the component circuitry has a speaker for sounding one or more alarms. The edge of the covers defines a key ring hole 17 that has on or more small holes that may be sealed. In those embodiments a removable rubber plug 5 is inserted into the hole to prevent moisture and water from entering the cavity holding the component circuitry 20. As an alternative, a larger rubber plug could fill the entire keyhole opening 17 or at least cover the annular inner surface of the keyhole.

Figure 2A:
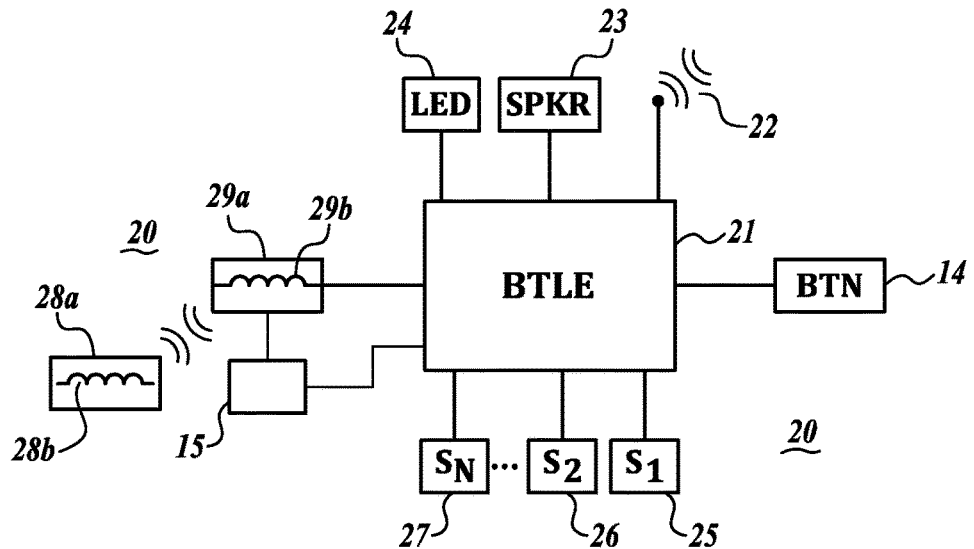
FIG. 2A is block diagram of elements on the PCB.

FIG. 2 shows the component circuitry 20 of the PCB 12, including a Bluetooth low energy (BTLE) core device 21. The core device 21 includes a transceiver for sending and receiving information signals and control signals. The core device also includes a microprocessor, read only memory and random access memory sufficient to enable the core device 21 control the other components on the PCB 12. In a further embodiment, a permanent or removable memory device is added to the device. The memory may be added through another side hole similar to the side hole formed by walls 14*b*, 14*c* that hold the rubber button 14*d* in place. The memory device could be inserted or removed through the second sidewall hole and a rubber stopper, similar to rubber button 14*a*, would seal the opening second sidewall hole. The memory device may hold information sensed by the sensors.

The core device 21 is assigned a unique identification code known to the user and the core device broadcasts the code at periodic intervals. The maximum range of the core device 21 is approximately 300 feet. Broadcasts are made using a ceramic antenna 22. The ceramic antenna saves space. A typical ceramic antenna may take up only 20% of the space occupied by a trace antenna, thereby contributing to the overall small size of tracking device 10.

The core device 21 controls a speaker 23 and a light emitting diode (LED) 24. The speaker 23 and the LED 24 provide alarms for the tracking device 10. The cover 11 is thin enough to allow light to pass through. In alternate embodiments and clear or highly translucent window is provided in the cover 11 above the LED 24.

The core device 21 is connected to one or more sensors 25, 26 or any number of sensors 27. The sensors in some embodiments sense physical parameters experienced by the tracking device 20, including and not limited to displacement, motion, acceleration, electromagnetic radiation, radioactivity, temperature, sound, pressure and other physical parameters. In some embodiments, a sensor 25 is a combined 9-axis motion sensor and temperature sensor. The sensor 25 has an accelerometer, gyroscope, and magnetometer for each axis. The information output by the 9-axis sensor enables the receiver to track the position of the tracking device from one location to another location. The motion of the tracking device can be monitored continuously as long as a receiver is close enough to record the motion output information of the 9-axis sensor 25. As an alternative, the information may be stored in the memory.

A multi-function button 14*a* is operable to perform one of more functions described in more detail below. The single button 14*a* on the tracking device 10 and one or more control programs resident on a control apparatus 37 (see FIG. 3) operate together to set one or more alarms, pair triggers and remotely control operations of the control apparatus 37. Those skilled in the art understand that a control apparatus may be any electronic device with processor, memory and communication ability including and not limited to a smartphone, a desktop computer, a laptop or notebook computer, a tablet computer, a personal digital assistant, or any equivalent device that can store and hold programs and data, execute programs, receive and/or transmit information and commands via wired or wireless channels of communication.

Some embodiments of the invention are equipped with rechargeable batteries that may be recharged via a wireless or wired recharging apparatus or a solar recharging apparatus. Wireless chargers, also known as induction chargers, typically place one coil in a charging device or pad that is connected to an AC power source and another (receiver) coil inside the device with a rechargeable battery. As shown in FIG. 2, a transmitter module 28a has a transmitter coil 28b that produces a time-varying electromagnetic field that is coupled to a receiver coil 29b of a receiver module 29a on the PCB 12. The receiver module 29a also includes circuitry to convert AC voltage and current to DC voltage and current. The core device 21 controls operations of the receiver module 29a and turns it on and off to recharge the battery 15 as needed. Transmitter and receiver modules are available from a number of integrated device manufacturers.

Other embodiments of the invention may have wired rechargers. These are well known devices and may be incorporated into tracking devices 10 by providing a suitable port (not shown) to receive power from an external power source. However, such external ports provide openings in the covers 11, 16 where water or other fluids may gain entry to the cavity holding the PCB 12 and its component circuitry 20.

Figure 2B:
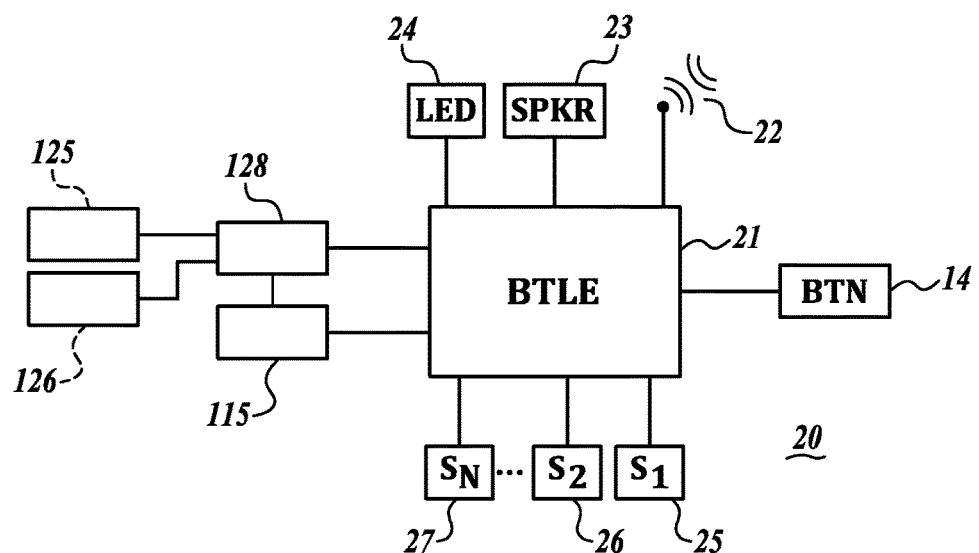
FIG. 2B is a partial schematic of an alternative charging system.

Still other embodiments may have solar recharging systems such as shown in FIG. 2B. One such solar recharging system 120 has one or more solar cells 125, 126 located on respective covers 11, 16 and connected to a battery regulator circuit 128 and rechargeable battery 115. Core device 21 is connected to the regulator circuit 128 and battery 115. The core device 21 uses the solar current to know whether the tracking device is in available light or not. In that way, the solar cells provide a dual role by acting as light sensors. This allows further flexibility by pairing any other sensed parameter to the presence or absence of light. The amount of current generated by the solar cells 125, 126 indicates the intensity of light received by the tracking device 10.

Other embodiments of the tracking device have circuitry for harvesting RF power to charge the battery 115. At http://www.hindawi.com/journals/apec/2010/591640/there is described an RF harvester having a GMS antenna, one or more resonant circuits, boosters, peak detectors and an adder. The circuitry contains passive components and is designed to have tuned circuits at known frequencies of cell phone towers (960 MHz) and Bluetooth devices (2.4 GHz). The boosters are Villard voltage multipliers. Reported test results show the RF harvester located within 500 meters of a cell tower was capable of generating 158 nW and successfully operated a calculator and a light emitting diode.

Figure 3:
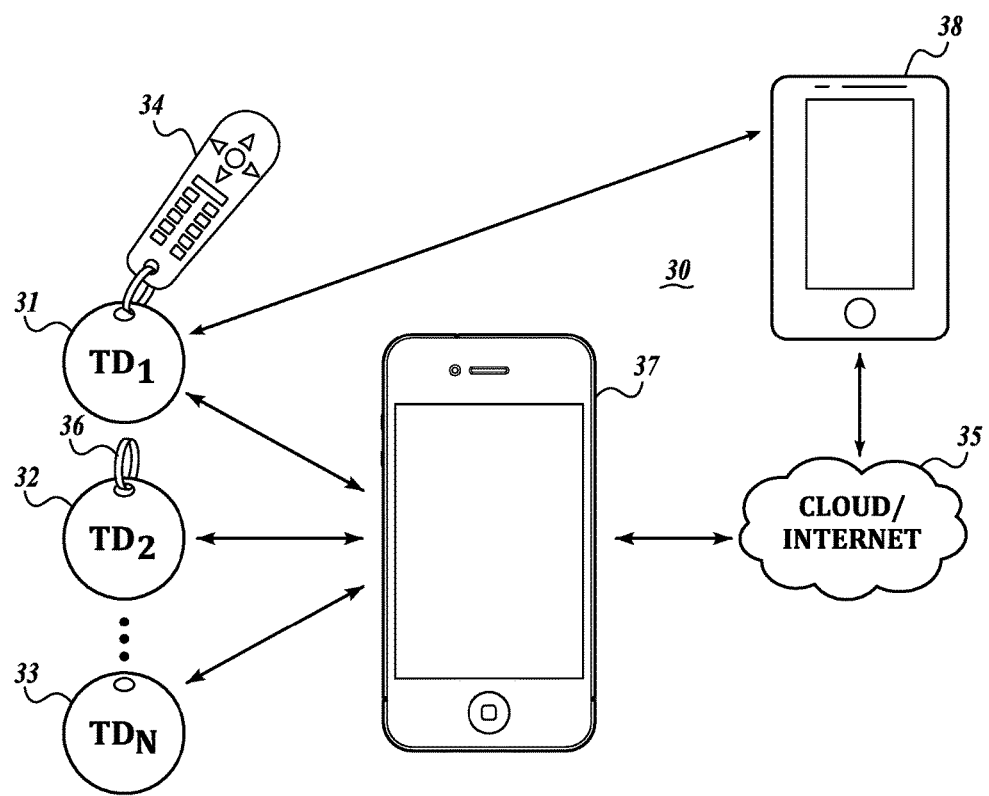
FIG. 3 is a view of the basic tracking system.

Turning to FIG. 3, an embodiment of a first system 30 is shown. The system includes tracking devices TD1 32, TD2 32, . . . TDN 33. Each tracking device 10 is paired with a control apparatus 37 which may be a computer, a tablet or a smartphone. The control apparatus 37 has a transceiver for establishing a wireless connection to the cloud/internet 35. In this patent a symbolic cloud and the reference number 35 are metaphors for the internet itself, for local area networks, for wide area networks and for individual sites on the internet where users may store and retrieve programs and data. Control apparatus 37 may create one or more alerts based upon the relative location between the control apparatus 37 and tracking devices 31-33 and information detected by the sensors 27 in the devices. The system 30 may be used to find a lost object attached to a tracking device 10, set an alert for when an object, pet or person bearing a tracking device 10 moves into or out of one or more predetermined ranges, and pair alerts with locations or motions of the tracking device 10. The owner-user may share with others information transmitted by the tracking devices 31-33 and control of devices 31-33. Accordingly, another user with a control apparatus 38 may use the same tracking devices 31-33 to establish alerts on the control apparatus 38 that are different from those of the alerts created by control apparatus 37.

Remote controls for television sets are frequently lost. The system 30 solves the problem of finding a lost remote control or other object 34. A tracking device 31 is attached to a remote control or object 34. Any suitable means for attaching is acceptable including hook-and-loop fasteners or adhesives that attach to the object 34 and the tracking device 31. Other attachment means include a chain or cord for attaching the object 34 via a key ring hole. The control apparatus 37 has a program 100 that provides a control menu associated with the tracking device 31. The tracking device 31 has a speaker 23 and an LED 24 that operate upon commands received from the control apparatus 37. The control apparatus 37 sends a suitable signal to the core device 21 to cause the speaker 23 to generate a distinctive sound, such as a buzz or ring, and to operate the LED 24 in a flashing mode, or both, in order to locate the object 34.

The system 30 may also monitor when an object, pet or person enters or leaves a predetermined range with respect to the control apparatus 37. For example, another tracking device 32 has a cord or chain 36 connecting via a key ring hole to and object, a collar of a pet, to an article of a person's clothing, surrounding a wrist of a small child or an Alzheimer patient. The control apparatus 37 sets one or more alerts depending upon the distance between the control apparatus 37 and the tracking device 32. If a parent were shopping with a small child, the parent may program the control apparatus 37 to issue one or more alerts depending upon the distance between the child wearing tracking device 32 and parent carrying the control apparatus 37. If the child and parent became separated by a first predetermined distance, such as 10-15 feet, the control apparatus would emit a first alert, such as one of the many sounds or vibration patterns that are included on a smartphone. If the separation becomes larger, such as 30-50 feet, a second alert would occur with a different sound and/or vibration. A third alert could be provided when the tracking device 32 lost radio contact with the control apparatus 37.

The system 30 may remind a user to take along key personal items before leaving a predetermined location. Tracking devices 33 could be attached to a key ring, a laptop or tablet computer, a brief case, a purse, a wallet, luggage, a backpack or other personal items. A user may carry the tracked items during travel from one place to another. If the user departs a location and forgets the tracked item, an alert would sound on the control apparatus 37 to advise the user he or she forgot the tracked item. Such alerts may be paired to specific locations to that they are only triggered when and where the user wants.

The core device 21 of each tracking device 31 has a clock. The beacon signal and any signal from a sensor may include the time the signal is sent. The clock also may be used to extend the life of the battery 15. The control apparatus 37 may set the tracking device to a power savings mode where its broadcast signal is only active for a short period of time compared to the intervals between activation. The core device also tracks time and any alert may be paired to one or more chosen times or day, week, month or year.

The system 30 may also alert user when an item has returned. For example, assume the tracking device 32 is attached to an automobile operated by another member of the user's household. When the driver of that automobile returns home, the tracking device will trigger an alert in the control apparatus 37 to alert the user that the automobile bearing the tracking device 32 has returned within range of the control apparatus 37.

The tracking devices 33 may have their alerts paired to one or more locations. For example, if a user places tracking device 32 on a briefcase or backpack, the user has little need to be warned of leaving the vicinity of the briefcase or backpack when the user is at home or at work. Those locations may be excluded from alerts and all other locations could be active. This embodiment would be especially for commuters who take a train or bus. The alarm could sound if the commuter moves more than 10 feet from the tracking device on the briefcase or backpack.

Among the numerous options available to the user is the option to have one or more alerts activated on the control device 37, the tracking device 32 or both. Recall that some embodiments include a 9-axis motion and temperature sensor 25. Sensor readings are transmitted by core device 21 and received and recorded by the control apparatuses 37, 38 and any other control apparatus with permission to control the tracking device 31. So long as the tracking device 31 is within range of at least one control apparatus, the GPS location of the apparatus and the motion of the tracking device 31 can be viewed on line in real time or at a later time by other users, such as 38. In one embodiment a tracking device 31 is fixed to a snowboard and the snowboarder carries a control apparatus 37 that continuously receives the motion data from tracking device 31. All travel of the snowboard, including vertical travel up ramps and acrobatic flips and turns of the snowboarder will be sensed by the 9-axis sensor and sent to the first control apparatus 37. That apparatus can be set to record the information received from the tracking device 31 or to continuously transmit the information to the cloud/internet 35.

Another feature of each tracking device is the ability of the owner of the device to share device information or control or both with others. For example, a remote user with control apparatus 38 and with shared privileges may access the cloud/internet 35 and use the recorded motion information to drive a display showing an icon moving in accordance with the same motion as the tracking device 31. In some embodiments the shared users are designated as "friends" of one or more tracking devices that are generally under the control of the owner of the tracking device. As will be explained later, an owner may voluntarily transfer control of a tracking device to another authorized user or simply relinquish control of a tracking device to any other authorized user who is or passes within range of the relinquished tracking device. An authorized user is, at a minimum, a user who has a control apparatus with a copy of an operating program for controlling tracking devices. In other embodiments authorized users are registered with a central user site that may be accessed through the interne.

Embodiments with the 9-axis temperature sensor may be used to pair location, time, temperature, direction, and position, velocity and acceleration in each of three axes of motion. For example, a user could set an alert to show whether the speed of a tracking device 31 exceeded a threshold of 10 miles per hour in the time between 10 AM to 11 AM on Aug. 4, 2014, when the temperature was between 75-85° F. while traveling north) (0-90°) within the city limits of Seattle, Wash. As such, motion, time, temperature heading and location may all be paired together or in any combination of one or more types of sensed information to set an alert. The pairing of tracking device 31 with a smartphone having GPS has endless possibilities. Motion data can be configured to user-defined alerts that include activating the speaker and LED 24. For instance, if a user was jogging and his speed dropped below a threshold, the speaker 23 on the tracking device 10 would buzz. In another embodiment the tracking device 10 monitors temperature outdoors, and buzz from speaker 23 could warn the user when the temperature dropped below a level that would harm outdoor plants.

In some embodiments the 9-axis sensor enables the system 30 to control functions of the control apparatus 37. A control program 100 installed on the control apparatus 37 records motion of the tracking device 31 and associates the recoded motion with a function of the control apparatus 37. With the control program 100 open, control apparatus 37 records a motion or set of motions of the tracking device 32. The user then associates the recorded motion of set of motions with a function provided on the control apparatus. Such functions include triggering an alert on the control apparatus 37 when the tracking device 32 moves in any direction, taking a picture with the control apparatus 37 in response to a first predetermined motion or first combination of motions of the tracking device 32, placing a phone call from the control apparatus (smartphone) 37 in response to another motion or another combination of motions of the tracking device 32, sending an email or text message from the control apparatus 37 in response to a third motion or third combination of motions of the tracking device 32. For example, the sensor 25 could be attached to a door or a window and any movement of the door or window would set off an audible or visual alarm on the control apparatus 37. A combination of motions such as shaking the tracking device 32 up and down could command the control apparatus 37 to take a picture. Moving the tracking device 32 left and right could command the control device 37 to send a message (email or text) to one or more addressees with a predetermined announcement, such as, a reminder to take medication. A user may map out specific locations, click the button and the tracking device 32 will save the place of interest. For example, a surveyor could walk a specific path, and mark specific points of interest such as corners of a road, or edges of a hill. The geographic properties of each point of interest would be saved and mapped out. Thus, the tracking device 10 has uses in the fields of gardening, home security, child monitoring, health/fitness, sports applications, navigation, commercial and industrial monitoring and safety appliances.

Figure 4:
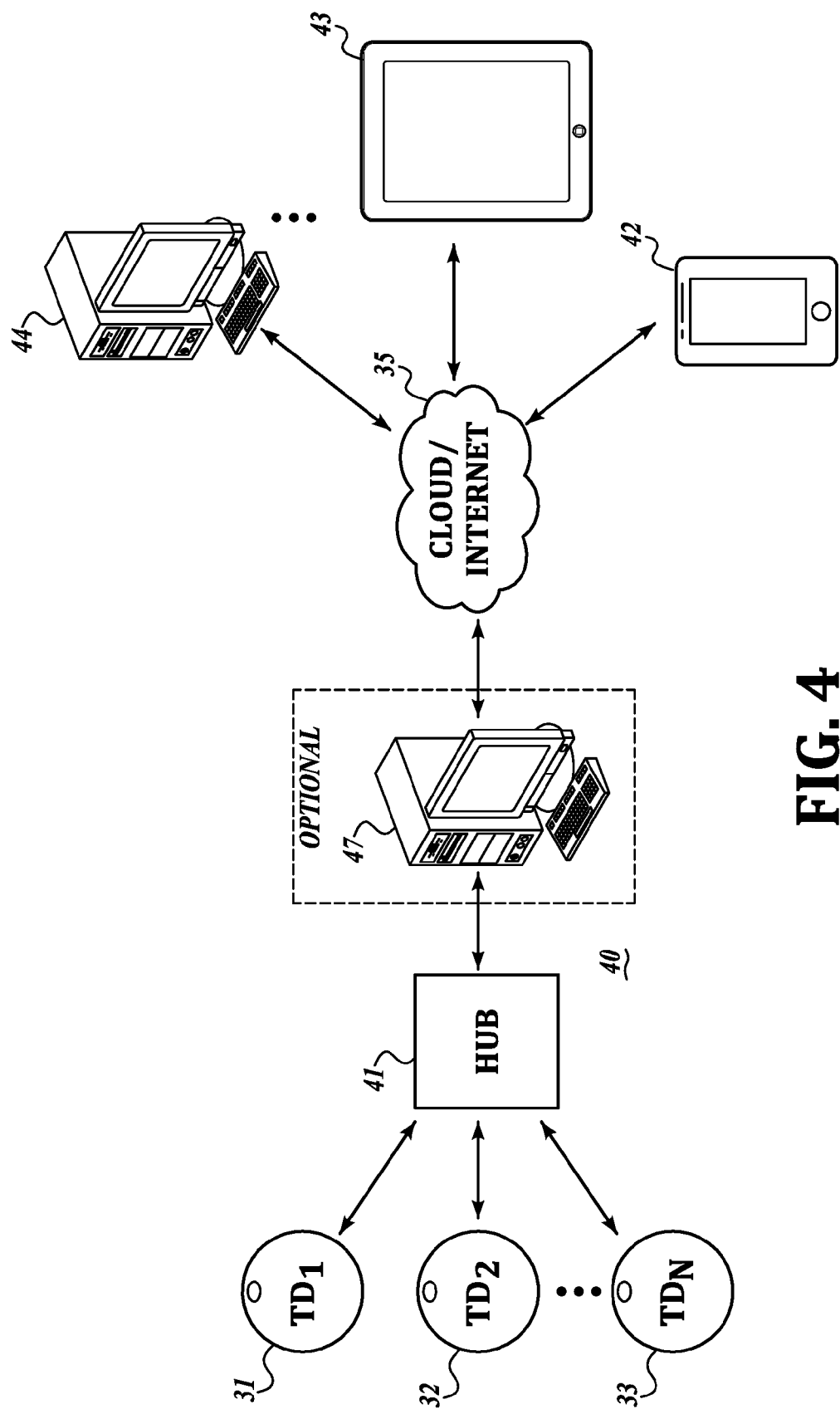
FIG. 4 is a view of a single hub (hive) tracking system.

Turning to FIG. 4, a first network 40 has tracking devices TD1-TDN, 31-33 that are in wireless communication with a hub 41. The hub 41 may be connected to a gateway system 47 that in turn is connected to the cloud/internet 35. In some embodiments of the first network 40, the hub 41 is directly connected to communicate with the cloud/internet 35. The hub 41 listens for signals from the tracking devices 31-33. The hub has Bluetooth or other wireless communication apparatus and can sense the range of each tracking device within its effective field. Upon receiving signals from one or more tracking devices, the hub relays information associated with the tracking devices to the cloud/internet site 35. Likewise, the hub 41 may send control information received from the cloud/internet site 35 to each or all the tracking devices 31-33.

Each tracking device 31-33 and the cloud/internet 35 associated with the devices has an owner and may have one or more shared users. As used in this patent, the term "owner" applies to a user of a tracking device 10 who has primary control over the tracking device 10 and the cloud/internet 35 associated with the tracking device. The embodiment envisions local, regional, national and international networks within the scope of cloud/internet 35. It also envisions registered owner-users of tracking devices and others register users with one or more dedicated cloud/internet sites 35 for collecting information about tracking devices 10. An owner-user may grant one or more privileges to others, known as "friends", allowing the other users some or all access or control of the owner's tracking devices and owner's account on the cloud/internet site 35. For example, one owner-user may give a friend a privilege to view all data on the cloud/internet site 35 or view data only associated with one or more tracking devices chosen by the owner-user for sharing. Even when the owner permits other users to see the data, some data may be marked "private" and excluded from the view of the shared user. An owner may also permit other users to control one, more, or all functions of individual tracking devices of the owner. An owner may also allow device data to be posted publicly, so that any user can view the data.

The friend feature solves a potential problem of locating lost tracking devices. If a friend finds a lost item of owner, the friend may discretely notify the owner that the friend has found the lost tracking device (and the object attached to the device) by calling the owner or sending the owner an email or text message that the friend found the tracking device at a particular location and time. The email could include a map with a pin showing the location.

In an alternative friend-based scenario, assume a user of control apparatus 72 who was granted privileges for the lost device 32 by its owner detects the lost device. The owner sees on the database that the user of control apparatus 72 is close to the lost device 32 and also has privileges for the lost device 32. The owner may contact the user of control apparatus 72 via telephone or email and ask the user to find the lost device 32 by initiating a sound or light alert on the device 32.

Shared use has a number of advantages. For example, assume the owner of the device 31 is away from home and receives a call from a member of his family asking for help finding a lost remote control attached to tracking device 31. The owner could log into the cloud/internet and send a suitable command to the tracking device 31 to operate its speaker 23 and its LED 24. If the owner had shared control of the tracking device with other family members, then the shared user could send the command to generate an alarm without contacting the owner.

The embodiment of first network 40 helps integrated multiple tracking devices 31-33 and Bluetooth devices. A control apparatus 37 (e.g. smartphone) does not have to control the tracking devices. Instead, all tracking devices 10 for an owner are registered in the hub 41 where each can be securely accessed from a smartphone or other control apparatus anywhere in the world. The registered tracking devices can be used for home security, automation, or playing games with friends across the world.

Figure 5:
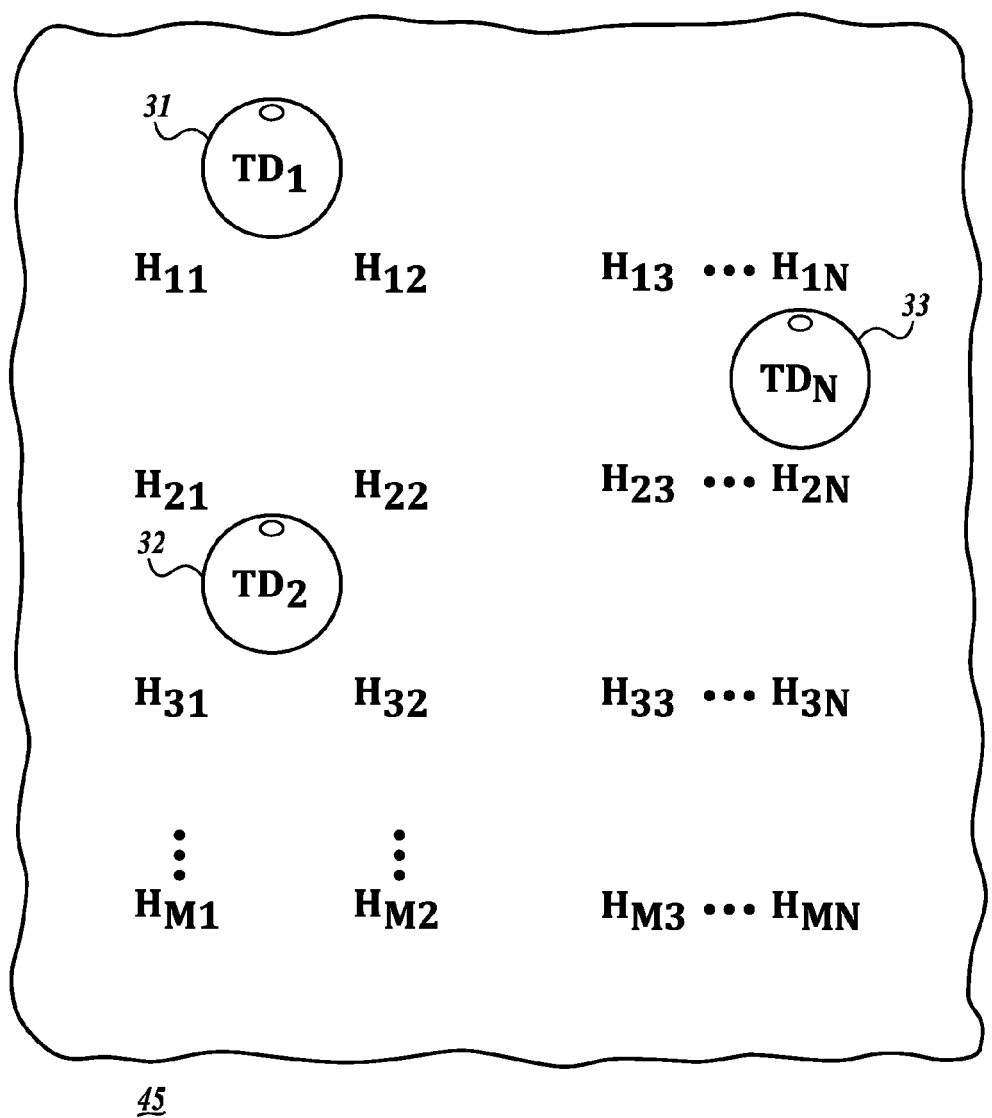
FIG. 5 is a partial view of a multi-hub tracking system

A second, wider area network embodiment 45 is shown in FIG. 5. There a plurality of hubs H11, H12, H21, . . . H1N, HMN are distributed over a predetermined area, such as a warehouse, college campus, hospital, airports, and offices. In a warehouse, tracking devices 33 are attached to stored items and any particular stored item can be immediately located by triangulating its position from the range signals detected by the hubs. On a college campus, the tracking devices could locate a lost smartphone, computer or book. In hospitals and offices the tracking devices could be attached to files so that anyone could find a desired file by accessing the cloud/internet 35.

Figure 6:
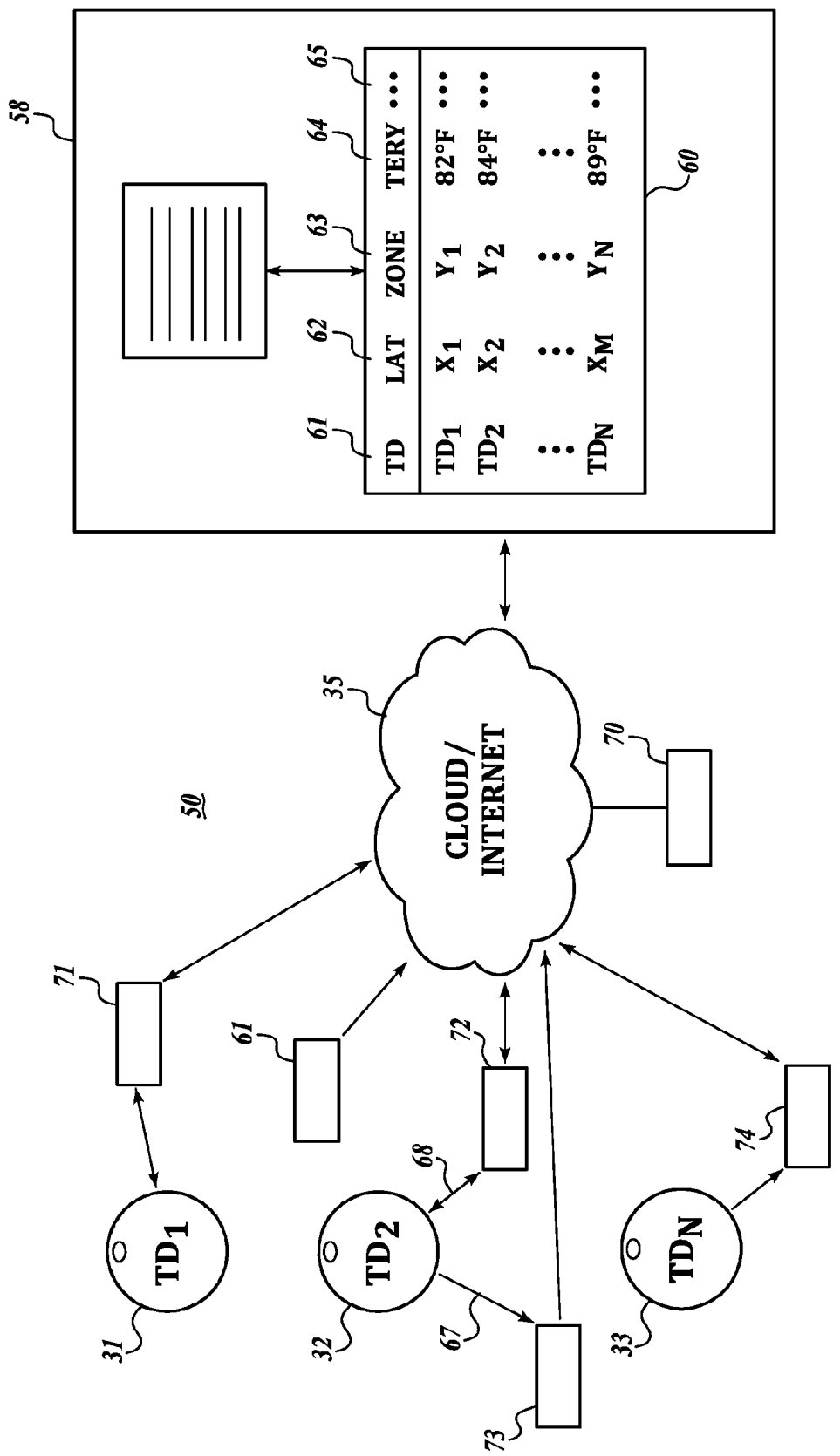
FIG. 6 is a view of a wide area location system for finding lost tracking devices or monitoring multiple sensors in tracked devices.

A third network embodiment 50 is shown in FIG. 6. An owner of multiple tracking devices 31, 32, 33 operates a control apparatus 70 that has two-way communication via cloud/internet 35 with the tracking devices 31, 32, 33. A server 58 is also in two-way communication with the cloud/internet 35. The server 58 includes one or more databases 60 that keep records on owners, users and each tracking device. For user of the network 50, the database 60 would show the devices owned by the user or those devices for which the user had granted or received one or more privileges or are marked for public access, the identity of each device that is owned or subject to a privilege granted or received, the information reported by each sensor of each device, including and not limited to the time the information was received and the location of the control apparatus that receives the information. At any time the owner 70 of the tracking devices 31-33 may view the historic information on the location and sensors of each tracking device of the owner, including the last known location of the tracking device and when the last known location was recorded in the database 60.

The owner's control apparatus 70 may be beyond the range of the transceivers in core devices 21 of the tracking devices. A number of other control devices 71-74 may be within range of one or more of the transceivers 21 in the tracking devices. Each tracking device uses its core device transceiver 21 to broadcast a periodic beacon signal with information including the identity of the tracking device and information from the sensors 25-27 of the respective tracking devices. Each control apparatus 71-74 receives the beacon broadcast and relays the information in the broadcast to the cloud/internet 35, including the GPS location of the control apparatus. The control apparatuses 71-74 do not need permission from the owner of the tracking devices to receive and forward the identity and sensor information. As long as the control program 100 for tracking devices is running, each control apparatus will receive the beacon signal from the tracking devices. No permission is required to receive the beacon signal. The retransmission of beacon information by the control apparatuses 71-74 imposes no hardship on them because each one likely transmits its own beacon signal to a cellular phone network or a local or wide area network.

The third network embodiment 50 may be used to locate misplaced items that are beyond the range of a control apparatus. An owner may access the database 60 and mark one or more of the owned devices as "lost." Assume that device 32 is owned by the operator of control apparatus 70 and is attached to a tablet computer (not shown). Assume another user carries control apparatus 73 and has no shared privileges for tracking device 32. Nevertheless, when control apparatus 73 passes within range of the beacon signal from tracking device 32, the identity of the lost device 32 and its approximate GPS location will be relayed via control apparatus 73 to the cloud/internet 35 and recorded on the database 60. That allows the owner to know the general location of the lost device 32. The approximate location can be displayed on a suitable application such as Google Maps, or MapQuest to provide the owner with local streets or landmarks where he may physically search for the lost device.

The database has numerous uses. Tracking devices 33 may be distributed over a large geographic area where each tracking device is in communication with a hub, such as shown in FIG. 5. The tracking devices may be located at one or more known locations or the hubs may provide GPS data. The sensors on the tracking devices could report their temperatures, air pressure, humidity, and other environmental characteristics via the hubs to provide data for a database 60 of the variable environmental characteristics of the geographic area.

There is a virtually unlimited number of sensors that can be used to provide trigger signals and a similar unlimited of responses or alerts that may be given in response to the trigger signals. Each tracking device has a button 14a and may have one or more sensors 25-27. The button and each sensor may generate a trigger signal. Trigger signals may be combined in any number of combinations and/or sequences of trigger signals to generate particular trigger signals depending upon the occurrence of predetermined combinations and/or sequences of trigger signals. The tracking devices and control apparatuses may also generate one or more responses or alerts upon receipt of trigger signals and combinations thereof.

Button 14a may be pressed one or more times to generate one or more button trigger signals. Two or more sequential pressings of the button 14a are an alternate trigger signal. The button may be held down to generate a long duration trigger signal or promptly released to generate a short trigger signal. A combination of long and short duration signals may also be used as a trigger signal.

For embodiments having a 9-axis sensor, any motion or combination and/or sequence of specific types of motion may be used to generate trigger signals. For example, when a tracking device 31 is used to secure a door or a window, any motion of the sensor may be a trigger signal. In other embodiments, specific user-defined spatial displacements are received and stored in the control apparatus as trigger signals for a response. For example, moving a tracking device left to right, shaking the tracking device up and down, moving the tracking device to define a letters, such as the letter "L", or moving the tracking device to define a shape such as a circle or square, are but a few custom motions. The shapes and letters could be paired with a click of the button 14a to indicate the start of a motion and second click when the custom motion is completed. The control apparatus would remember the click to start and stop and the motion between clicks.

Range is another trigger for the tracking devices. On the control apparatus the user may define one or more ranges for generating responses including alerts. One potential use is keeping a parent advised of the relative location of a child while shopping in a store. Different responses or alerts could be given at different ranges as the distance between the child and the parent varies. In the hive system of FIGS. 4 and 5, a trigger may be given when a tracking device leaves or enters the hive.

Location is a still another trigger. In some embodiments, the tracking device may carry its own GPS device and broadcast its latitude and longitude coordinates. In other embodiments, the tracking device may rely upon the GPS coordinates of any control apparatus that participates in systems such as shown in FIGS. 4-6 and is within range of any tracking device. In still other embodiments, the location of one control apparatus 37 may be paired with the range of one tracking device. For example, in the basic system shown in FIG. 4 control apparatus 37 provides the location of the control apparatus using its GPS function and pairs that location with the range between the control apparatus 37 and the tracking device 31. A user can have an alert triggered when the distance between the control apparatus 37 and the tracking device 31 exceeds a predetermined distance selected by the operator of the control apparatus 37. A user can also set an alert that is only active at a "home" location to remind the user to take a laptop to which the tracking device 31 is fixed when the user leaves home. However, if the location were different from the "home" location, no alert would be given.

Time is another trigger signal. As explained above, time of day may be combined with other trigger signals to enable or disable one or more alerts, such as enabling a motion alert during the night but disabling the alert during the day.

Other trigger signals and their combinations and/or sequences are possible with added sensors. The tracking devices of the embodiments of the invention may use any of a vast number of sensors including and not limited to sensors for motion. Distance, velocity and acceleration, temperature, pressure, magnetic fields, gravity, humidity, moisture, vibration, pressure, light, electrical fields, ionizing and non-ionizing radiation, cosmic rays, and other physical aspects of the external environment; analytes for chemical or biological substances including and not limited to sensors for detecting toxic compositions such as carbon monoxide, carbon dioxide, methane, and other hazardous or poisonous components. The tracking devices may be worn as badges by personnel to detect ambient analytes and physical parameters. The data collected by the tracking device may be sent to the data collection center 58 where others can analyze it and provide responses or alerts to the personnel wearing the tracking devices.

The control apparatus has a program that allows the user to create custom trigger signals including combinations and/or sequences of individual trigger signals. The control apparatus, the tracking device or both may generate one or more responses to a trigger signals or a combination of trigger signals. The tracking device, the control apparatus or both may give responses or alerts.

The foregoing embodiments of tracking devices provide audible and visual alerts, but could also vibrate the tracking device upon receipt of a command or trigger signal. In the embodiments described above the tracking devices and the control apparatus may establish a remote control system between themselves to cause one of the system components to execute a function upon receipt of a predetermined command or trigger signal from the other component. For example, a custom motion trigger signal of the tracking device may remotely control the control apparatus to take a picture, send a message via email of SMS, make a phone call to a predetermined party, and combinations thereof such as take and send a picture to a predetermined party or group of predetermined recipients.

Figure 7:
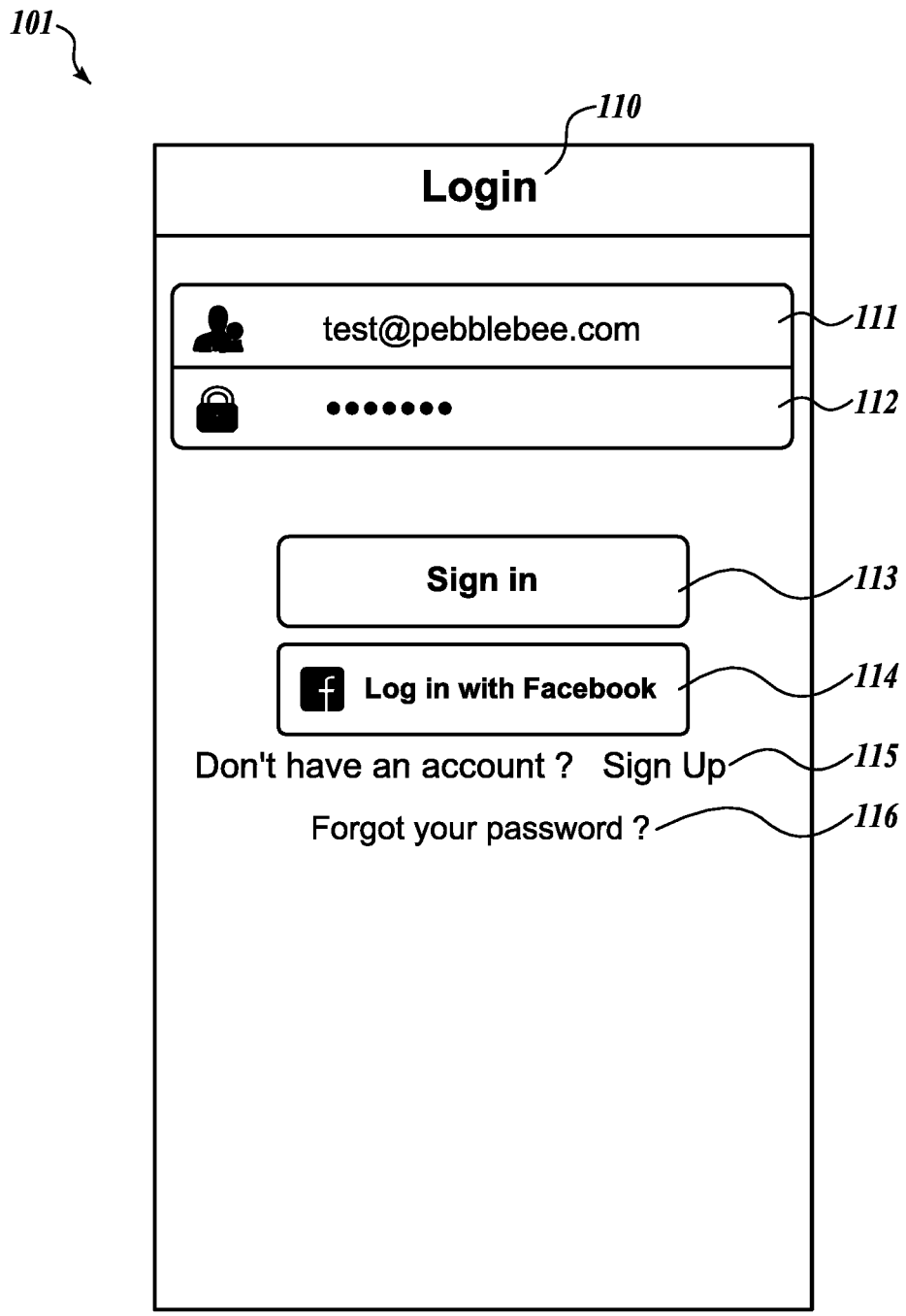
FIG. 7 is a view of screen shot 101 of a control program.

The control program 100 is shown by means of screen shots 101-109 and FIGS. 7-15. Turning to FIG. 7, screen shot 101 shows a login screen for the control program. The login screen has a legend "Login" in banner 110. Below the banner are two rows 111, 112 for a user's email address or user name and password, respectively. In row 113, the user may sign in via the indicated website pebblebee.com or, in the alternative, login through Facebook using the button on row 114. Rows 115 and 116 allow the user to set up an account or recover a forgotten password.

Figure 8:
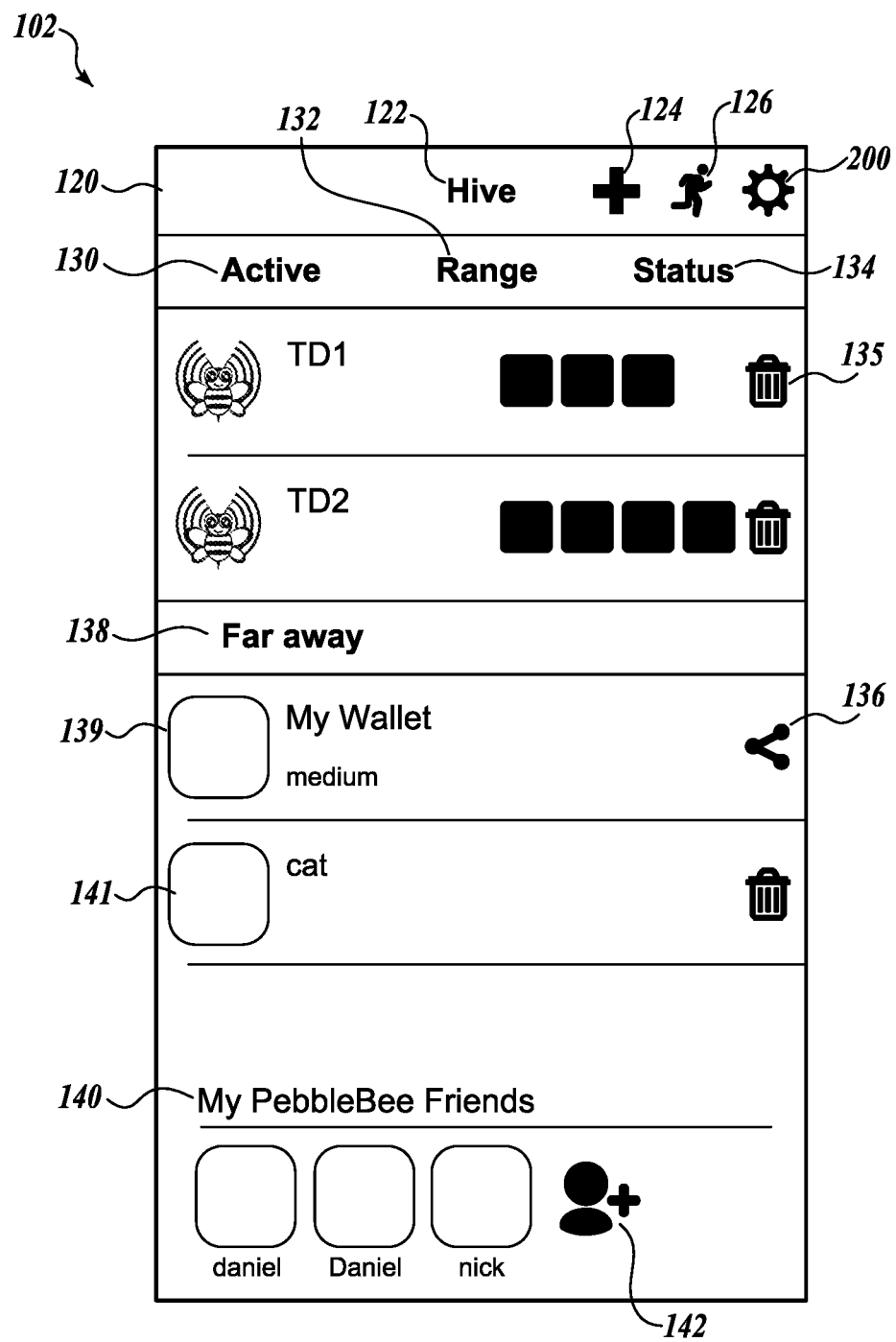
FIG. 8 is a view of screen shot 102 of a control program.

Turning to FIG. 8, and screen shot 102, the user is presented with an image of a hive 122 of tracking devices. A hive is a group of tracking devices owned or controlled by a user of the program. In the top banner 120, there are control buttons 124, 126, and 200, respectively, for enabling the control apparatus to receive and send Bluetooth transmissions, release one or more of the tracking devices from the hive, and set general settings for the tracking devices. Banner 130 defines columns for active devices 130, their range 132, and status 134. For example, tracking device TD1 has a range indicated by three squares and a status showing a can 135. The can 135 indicates that the device is under control but may be released if so desired. In the next row, another tracking device TD2 is closer as shown by the four status squares, and it is also under control as shown by the can 135.

In the hive, there are several more devices, which are located far away. See the Far Away banner 138. Far away devices include a device identified as My Wallet 139, and another device identified as cat 141. Note that My Wallet has a Y-shaped symbol 136 to indicate that the tracking device on the wallet is shared with another user. Near the bottom of the screen shot, a banner 140 shows Friends. A friend is any other user who has some control over one or more of the tracking devices. The symbol 142 indicates a button that may be pressed to add additional friends. To the left of the symbol 142 are shown existing friends.

Figure 9:
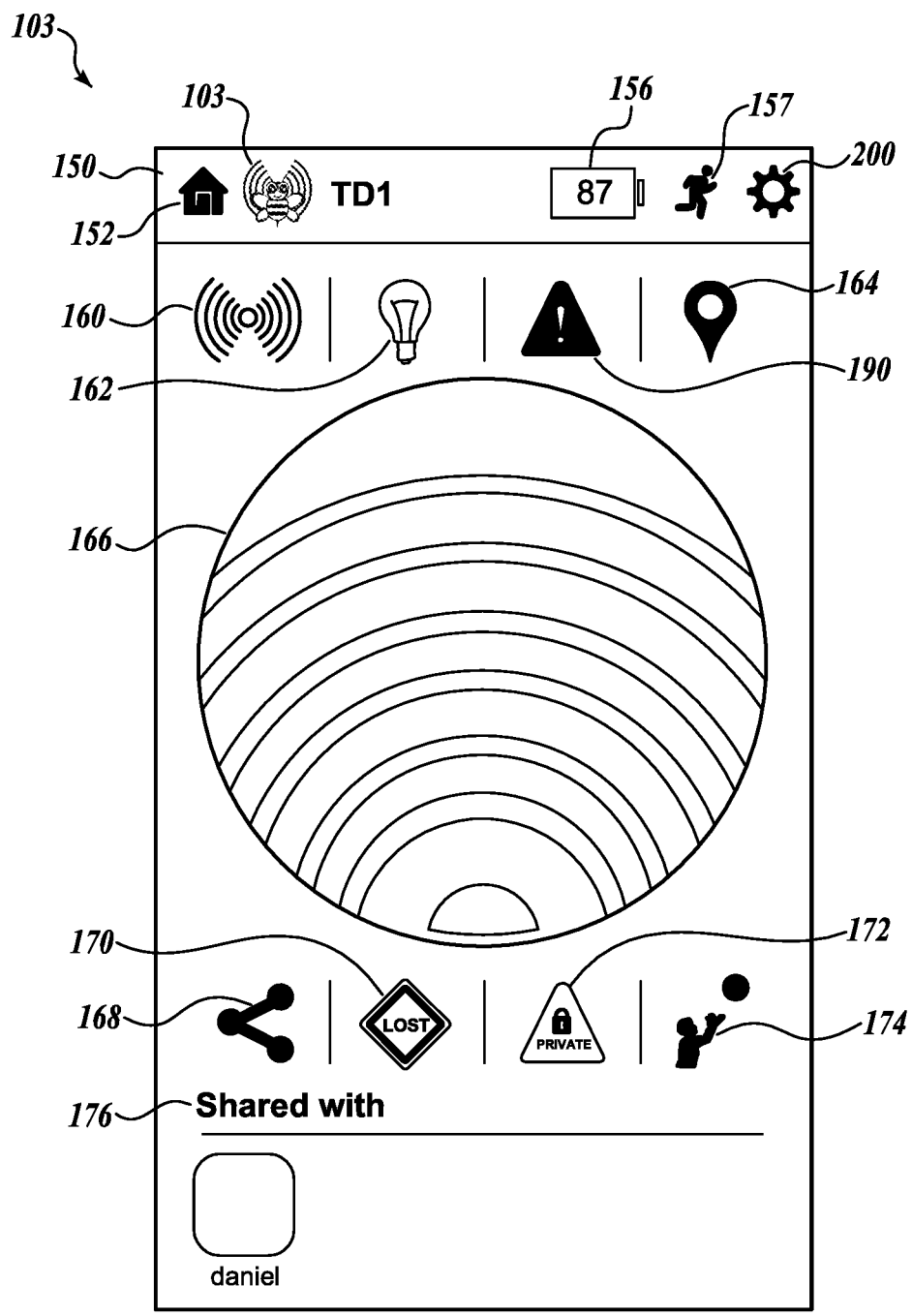
FIG. 9 is a view of screen shot 103 of a control program.

Turning next to FIG. 9, screen shot 103 shows a particular control screen for the tracking device TD1. Clicking or typing on one of the tracking devices shown in screen shot 102 accesses screen shot 103. Top banner 150 has a number of status symbols. A user returns to the prior screen 102 by pressing the hive symbol 152. Symbol 156 shows the percentage charge of the battery, symbol 157 is the release symbol, and symbol 200 is for general settings.

Below banner 150 are a set of symbols for immediate alerts, paired alerts, and locations for the tracking device. Symbol 160 when touched will immediately sound the audible alarm through the loudspeaker of tracking device 1. Symbol 162, a light bulb, when touched will cause the tracking device LED to emit periodic light by blinking its LED. If the tracking device is equipped with a vibrator, another symbol would be provided to indicate the vibrator. Symbol 190 allows the user to set up alerts, which include a combination of conditions as will be explained later. Symbol 164 is a mapping signal, which allows the user to acquire and display a map of the current location of the tracking device TD1.

Symbol 166 corresponds to the top cover 11 of the tracking device. The concentric arcs radiating from the bottom of the circular cover represent the relative range between the control apparatus and the tracking device. On the display, the arcs within the circular image 166 will bear different colors and will gradually fill in from bottom to top as the control apparatus comes in closer proximity to the tracking device. Below the range circle 166, the user has a number of options. The user may select symbol 168 in order to share the device with another user. By selecting symbol 170 the user may designate TD1 as lost. Selecting symbol 172 marks TD1 as private and only the user may see the data generated from TD1 as well as the location of TD1. Symbol 174 allows the user to release all control of the tracking device TD1. At that point, the tracking device TD1 may be claimed and controlled by any other authorized user. The bottom banner 176 indicates other users with whom the current user has shared TD1.

Figure 10:
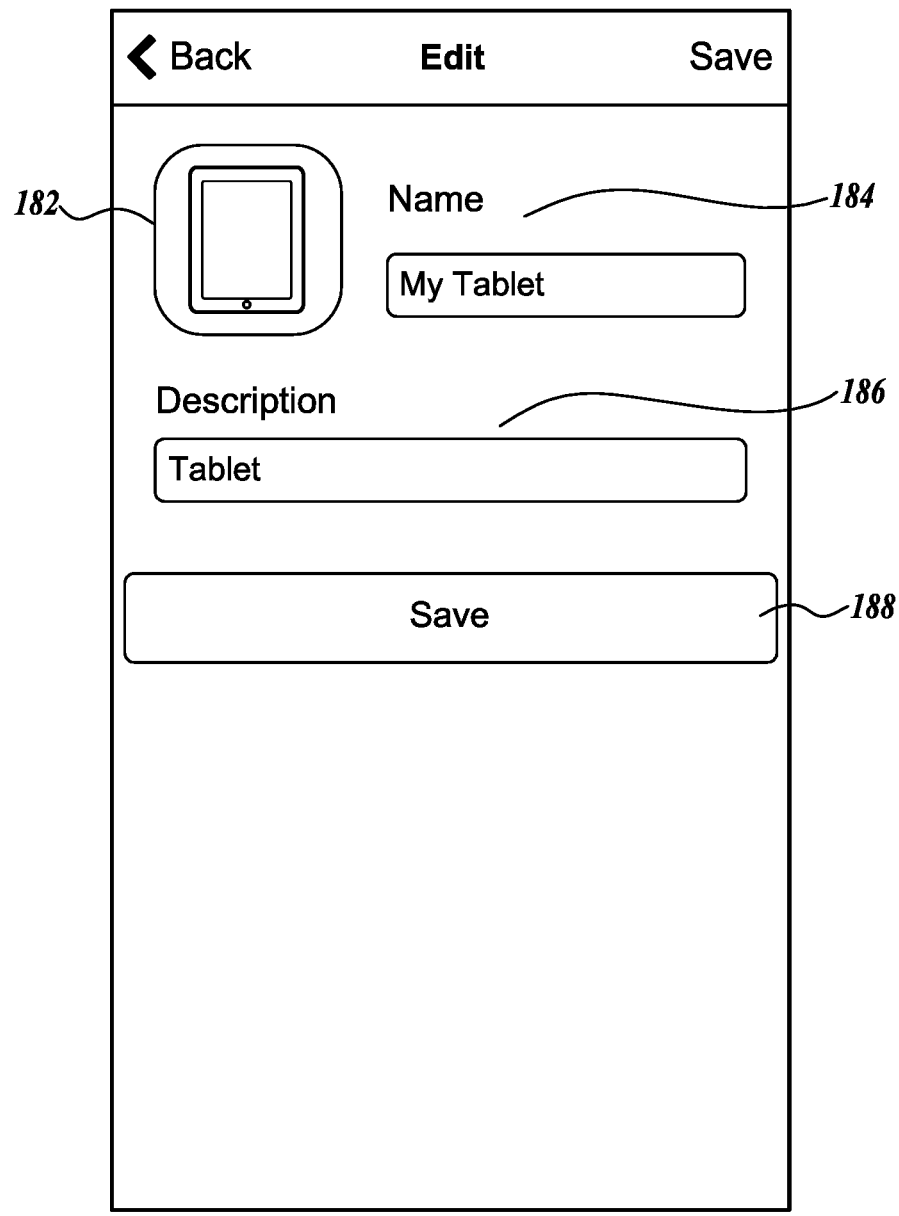
FIG. 10 is a view of screen shot 104 of a control program.

FIG. 10 shows a screen shot 104, which displays the general settings for tracking device TD1. By clicking on symbol 200 on screen shot 103, the user is taken to screen shot 104 where the user may enter particular information about the tracking device. For purposes of illustration, the user may enter a picture 182 of the tracking device or the object or person tracked. In this case, the tracking device is a computer tablet. In the entry 174, the user gave the name "My Tablet" to the tracked object. In box 186, the user may describe the object or person attached to TD1 and pressing bar 188 saves or the Save button on the top banner saves all settings. Pressing the Back button returns the user to screen shot 103. Pressing the Edit Button allows the user to make changes in the settings on screen 104.

Figure 11:
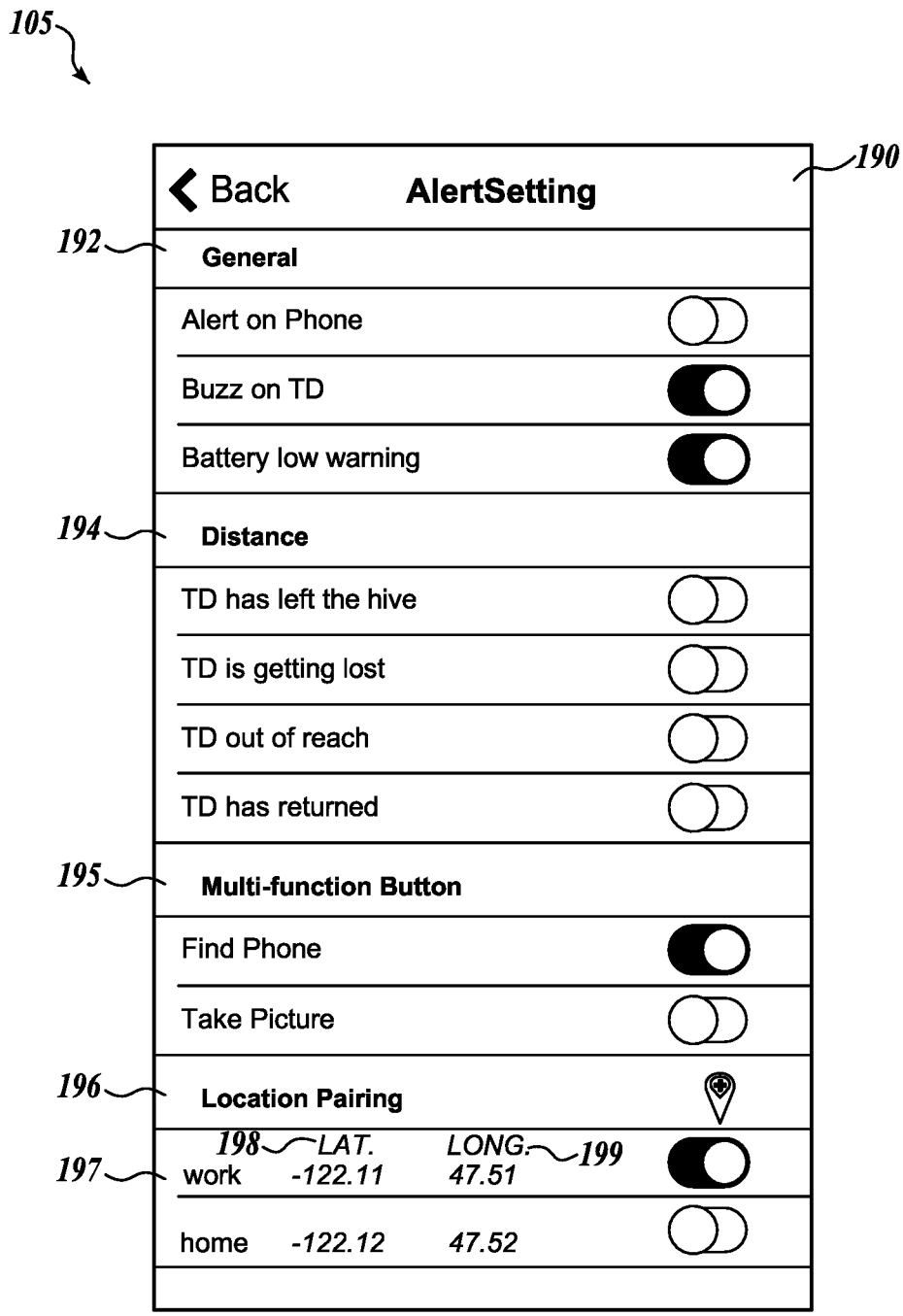
FIG. 11 is a view of screen shot 105 of a control program.
Figure 12:
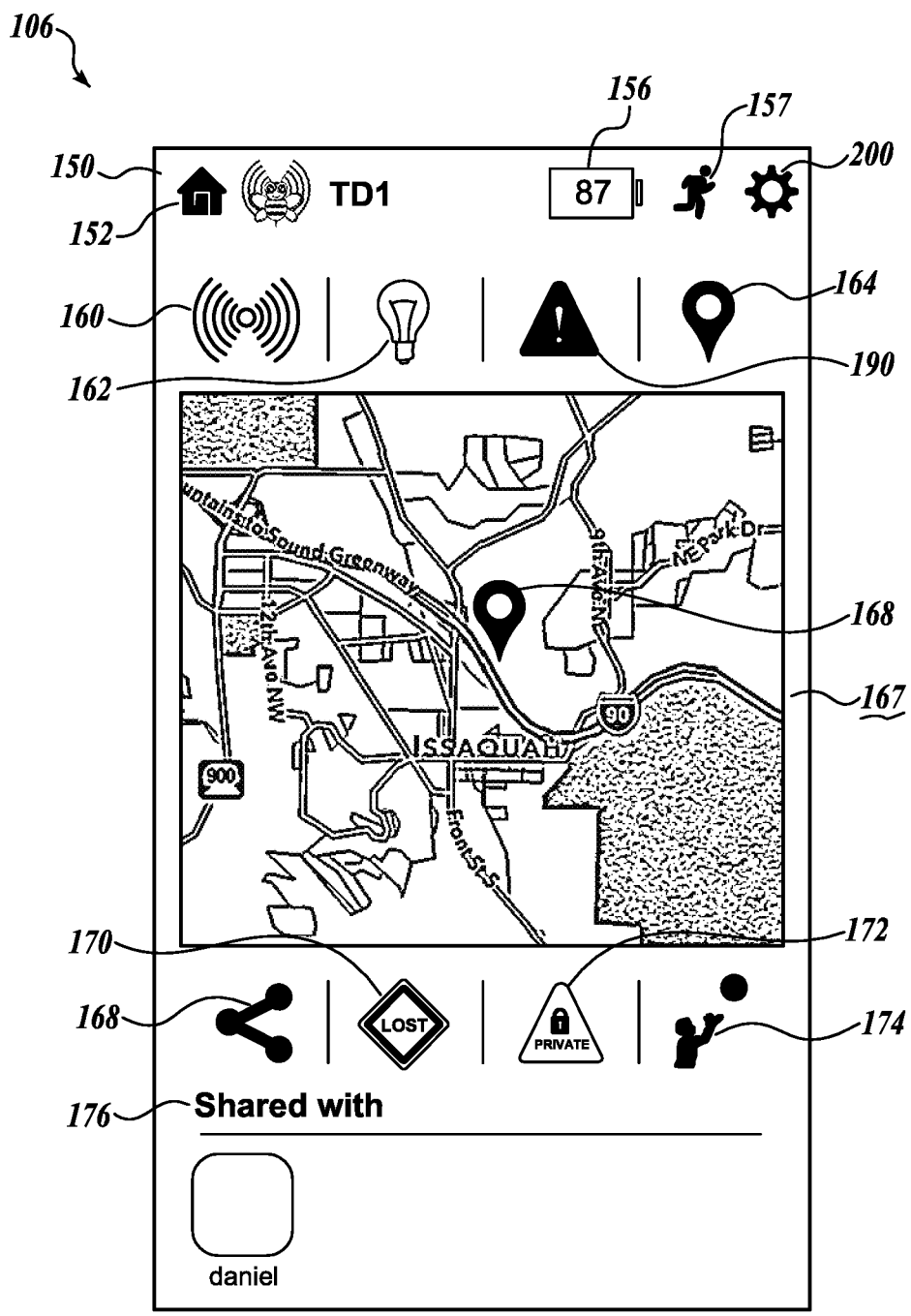
FIG. 12 is a view of screen shot 106 of a control program.

Screen shot 105 shown in FIG. 11 controls the Alert settings for the tracking device and the control apparatus. Pressing triangular symbol 190 in screen shot 103 of FIG. 9 takes the user to screen shot 105 of FIG. 11. In screen shot 105, the user has a number of options for setting alerts. The user may select the kind of alert (audio, light, vibration) and may also pair the alert with other conditions. Screen shot 105 is also used to establish remote control between the apparatus and TD1. As explained above, the tracking device may control the control apparatus 37 and vice versa. If desired, the user may have an alert show up on a control apparatus 37 such as the user's smart phone. In addition, the user may operate a loudspeaker on the tracking device. The user may also ask for an alert when the battery is low. Other alerts may be set for distance. For example, in the Distance alerts 194, the user has the option to set alerts for when the device leaves the hive (i.e., the range of the control apparatus), when it is nearing the edge of the hive, when it is out of the hive, and when it returns to the hive. Controls for the multi-function Button 195 allow the user to find the control apparatus 37 or set the multi-function button 195 to operate the control apparatus, such as a smart phone, to take a picture. In other embodiments, the multi-function button may send an email or text message to a predetermined party. Further alert settings depend upon conditions such as location pairing 196. In this case, the alert is conditioned upon the tracking device being at work or at home. As shown in FIG. 11, the locations are identified by latitude and longitude.

Returning to screen shot 103, the symbol 164 is a map symbol. Touching the map symbol 164 changes screen shot 103 from the range image to a map 167. The map 167 includes a pin symbol 168 showing the approximate location of the tracking device TD1. The location of the tracking device TD1 is acquired from other control apparatuses, which have acquired the beacon signal of tracking device TD1. See, for example, the system shown in FIG. 6 above.

Figure 13:
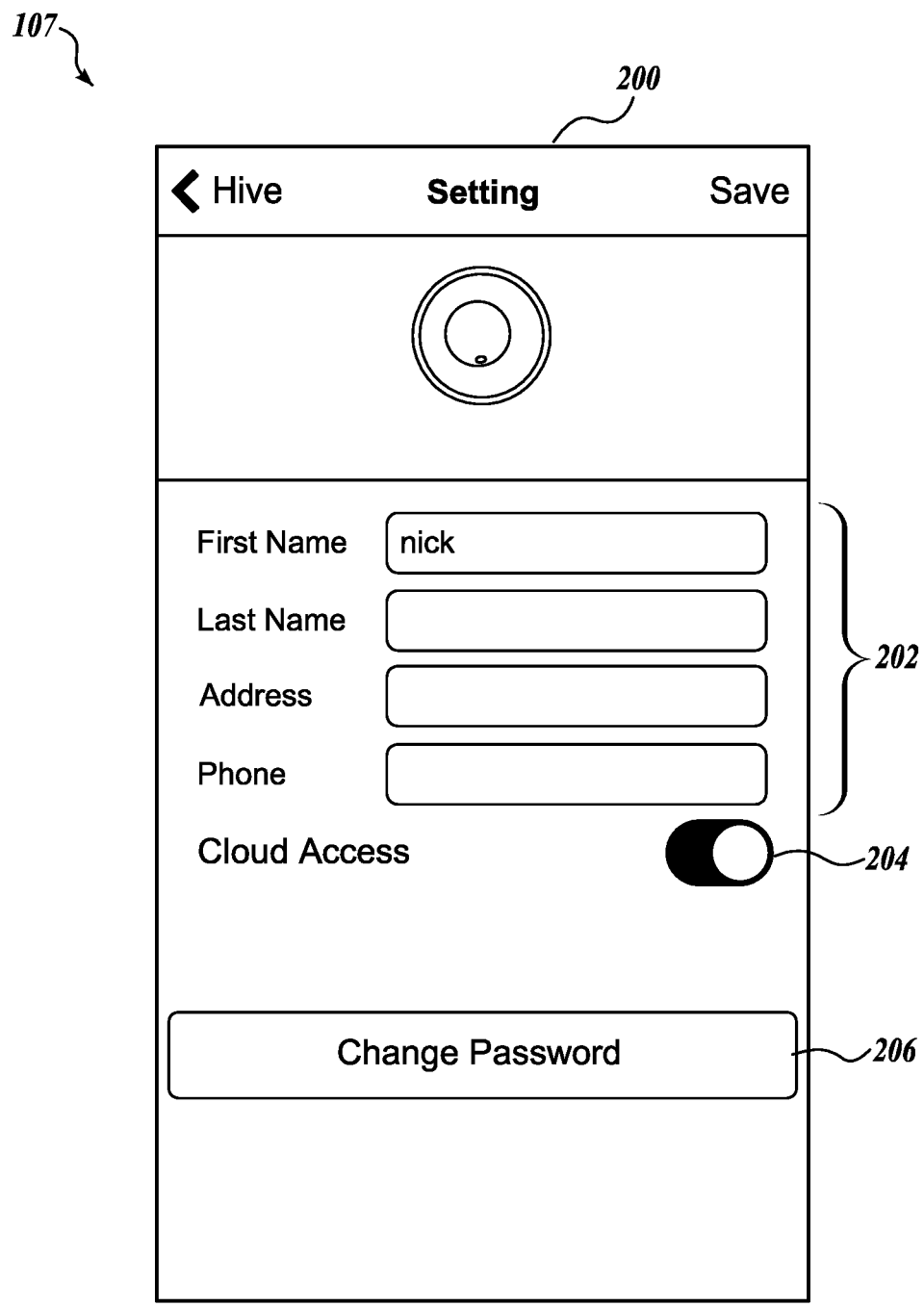
FIG. 13 is a view of screen shot 107 of a control program.

Screen shot 107, FIG. 13, shows the general settings for the user. In this instance, the user's address and information and phone number are established in boxes 202. Sliding the slide button 204 enables cloud access. The user may also change the password by clicking on the box 206.

Figure 14:
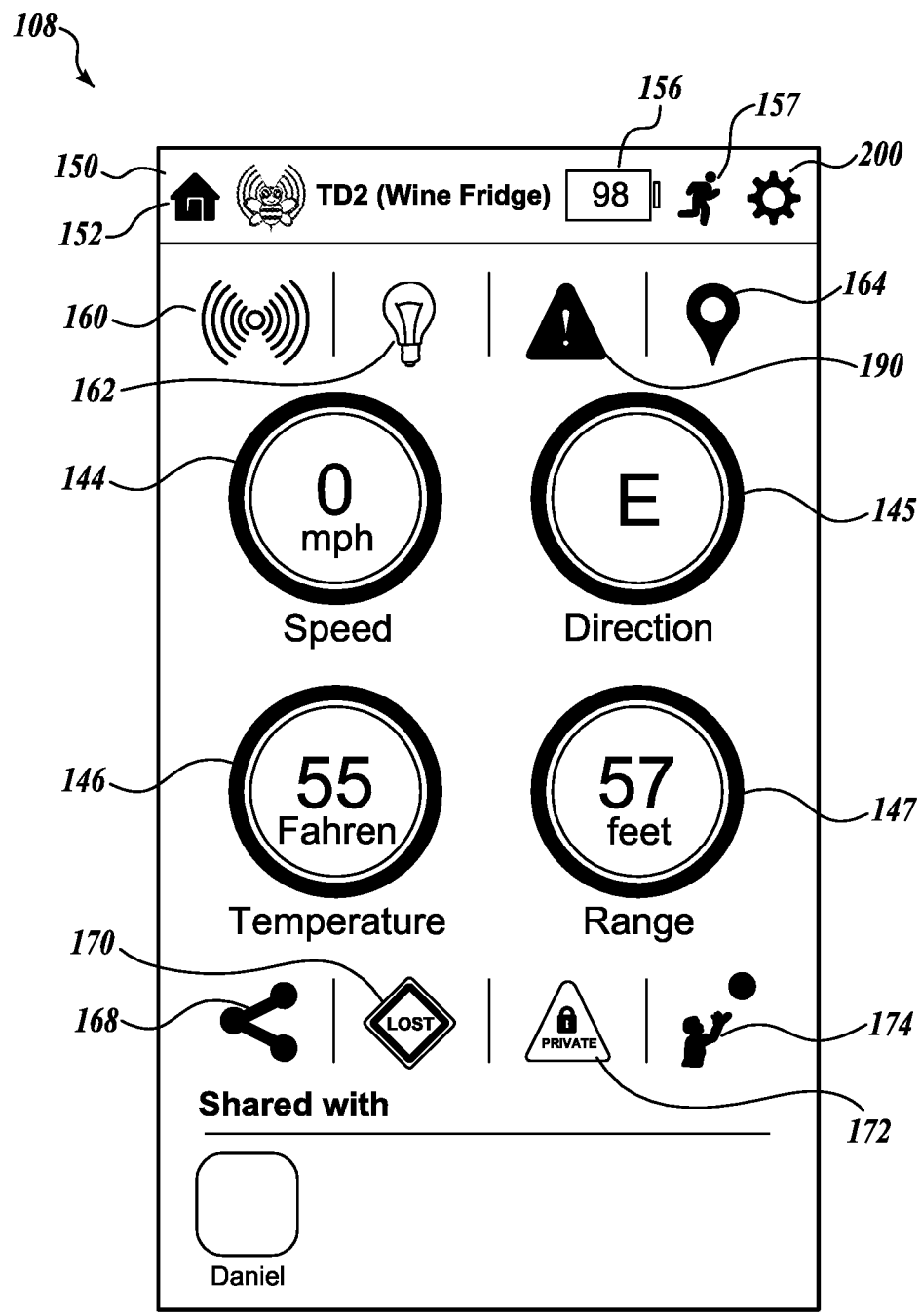
FIG. 14 is a view of screen shot 108 of a control program.
Figure 15:
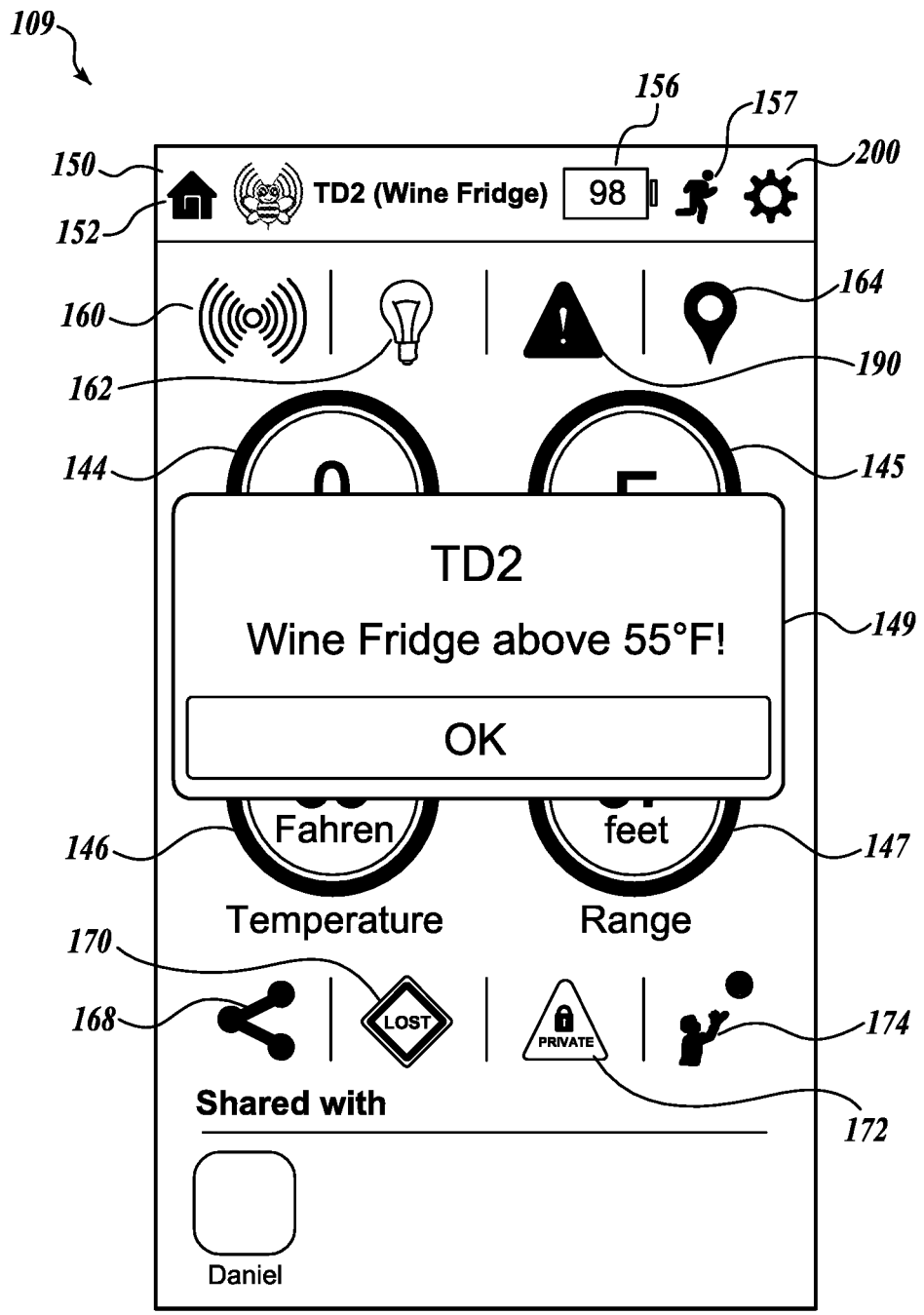
FIG. 15 is a view of screen shot 109 of a control program.

Screen shots 108, 109 in FIGS. 14, 15 show alternate views of screen shot 103 where the status of a tracking device that has a 9-axis sensor as well as a temperature sensor. In an example shown in FIG. 14, the tracking device TD2 is used to monitor the temperature of a wine refrigerator. Nevertheless, it displays the 9-axis information of the TD2, including its speed 144 and direction 145, as well as its range 147 and temperature 146. The temperature alert is set to 55° F. If the condition of the temperature changes and rises above 55° F., an alert is sent to the control apparatus. The alert appears on screen shot 109 in the display of the control apparatus with the banner 149 showing that TD2 Wine Fridge is above 55° F. Alert 149 on the control apparatus appears not only on the display, but also may trigger a vibration on the control apparatus and/or an audible signal as well as a banner notification.

While preferred embodiments of the invention have been shown and described, modifications and variations may be made thereto by those of ordinary skill in the art without departing from the spirit and scope of the present invention. In addition, it should be understood that aspects of the various embodiments may be interchanged either in whole or in part. Furthermore, those of ordinary skill in the art will appreciate that the foregoing description is by way of example only, and is not intended to limit the invention, except as further described in the appended claims. Those skilled in the art will understand that other and equivalent components and steps may be used to achieve substantially the same results in substantially the same way as described and claimed.

The embodiments of the invention in which an exclusive property or privilege is claimed are defined as follows:

1. A tracking device comprising:
   a first cover, wherein an inside edge of the first cover has a substantially circular cross-section;
   a second cover, wherein the second cover is shaped to mate with the first cover;
   wherein the first cover and the second cover form a cavity for receiving a battery when mated together;
   a printed circuit board having at least one sensor and a transmitter for sending signals including a signal with information for identifying the tracking device, said printed circuit board having a crescent shape that includes a first edge shaped to follow the inside edge of the first cover and a second edge shaped to follow a curvature of the cavity for receiving the battery; and
   at least one conductor coupled to the printed circuit board;
   wherein the at least one conductor includes a protrusion configured to contact the battery when the battery is positioned within the cavity; and
   wherein a non-conductive portion of the first cover or a non-conductive portion of the second cover holds the at least one conductor against the battery while the battery is positioned within the cavity.

2. The tracking device of claim 1, wherein the transmitter uses a low-energy transmission protocol.

3. The tracking device of claim 2, wherein the transmitter is a Bluetooth transmitter.

4. The tracking device of claim 3, wherein the low-energy transmission protocol is Bluetooth low energy (BTLE).

5. The tracking device of claim 1, wherein one of the first cover or the second cover has an opening for admitting the battery.

6. The tracking device of claim 1, wherein the printed circuit board has a mechanical button.

7. The tracking device of claim 6, wherein the first cover or the second cover includes an opening for a multi-function button that is aligned with the mechanical button of the printed circuit board.

8. The tracking device of claim 1, wherein the printed circuit board includes a speaker.

9. The tracking device of claim 1, wherein the printed circuit board includes at least one area having components aligned in a first direction and at least one area having components aligned in a second direction.

10. A tracking device comprising:
    a first nonconductive housing member;
    a second nonconductive housing member configured to mate with the first nonconductive housing member such that a cavity is formed between the first nonconductive housing member and the second nonconductive housing member, wherein the cavity is shaped to receive a battery;
    a printed circuit board positioned between the first nonconductive housing member and the second nonconductive housing member, wherein the printed circuit board has a transmitter for sending signals including a signal with information for identifying the tracking device, wherein the printed circuit board has an outer edge of a first curvature and an inner edge of a second curvature different from the first curvature, wherein the outer edge is shaped to fit within the first nonconductive housing member and the second nonconductive housing member, and wherein the inner edge is shaped to fit around the cavity; and
    at least one conductor coupled to the printed circuit board and configured to be in contact with a terminal of the battery disposed within the cavity;
    wherein the first nonconductive housing member or the second nonconductive housing member holds the at least one conductor against the battery.

11. The tracking device of claim 10, wherein the first nonconductive housing member or the second nonconductive housing member includes an opening for admitting the battery to the cavity.

12. The tracking device of claim 11, further comprising a means for retaining the battery within the cavity.

13. The tracking device of claim 12, wherein the means for retaining the battery within the cavity includes a lid.

14. The tracking device of claim 10, wherein the transmitter uses a low-energy transmission technique.

15. The tracking device of claim 14, wherein the transmitter is a Bluetooth transmitter.

16. The tracking device of claim 15, wherein the low-energy transmission technique is Bluetooth low energy (BTLE).

17. The tracking device of claim 10, wherein the printed circuit board has a mechanical button.

18. The tracking device of claim 17, wherein the first nonconductive housing member or the second nonconductive housing member includes an opening for a multi-function button that is aligned with the mechanical button of the printed circuit board.

19. The tracking device of claim 10, wherein the printed circuit board includes a speaker.

20. The tracking device of claim 10, wherein the printed circuit board includes at least one area having components aligned in a first direction and at least one area having components aligned in a second direction.

* * * * *